(12) United States Patent
Masunaga et al.

(10) Patent No.: US 8,288,076 B2
(45) Date of Patent: Oct. 16, 2012

(54) CHEMICALLY AMPLIFIED RESIST COMPOSITION AND PATTERN FORMING PROCESS

(75) Inventors: Keiichi Masunaga, Joetsu (JP); Satoshi Watanabe, Joetsu (JP); Akinobu Tanaka, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 224 days.

(21) Appl. No.: 12/789,747

(22) Filed: May 28, 2010

(65) Prior Publication Data

US 2010/0304302 A1     Dec. 2, 2010

(30) Foreign Application Priority Data

May 29, 2009   (JP) .................................. 2009-130020

(51) Int. Cl.
*G03F 7/004* (2006.01)
*G03F 7/30* (2006.01)
(52) U.S. Cl. ..................... 430/270.1; 430/326; 430/905; 430/910; 430/921; 430/922; 430/942
(58) Field of Classification Search ............... 430/270.1, 430/326, 905, 910, 942, 921, 922
See application file for complete search history.

(56) References Cited

U.S. PATENT DOCUMENTS

| | | | |
|---|---|---|---|
| 5,945,250 | A | 8/1999 | Aoai et al. |
| 7,288,359 | B2 | 10/2007 | Iwasawa et al. |
| 7,569,326 | B2 | 8/2009 | Ohsawa et al. |
| 2004/0260031 | A1 | 12/2004 | Takeda et al. |
| 2007/0149702 | A1 | 6/2007 | Ando et al. |
| 2008/0096128 | A1 | 4/2008 | Takeda et al. |
| 2008/0102407 | A1 | 5/2008 | Ohsawa et al. |
| 2008/0305411 | A1 | 12/2008 | Koitabashi et al. |
| 2009/0069521 | A1* | 3/2009 | Nagai et al. .................... 526/243 |
| 2009/0202943 | A1* | 8/2009 | Ohsawa et al. ............. 430/285.1 |
| 2009/0269696 | A1* | 10/2009 | Ohsawa et al. ............. 430/270.1 |
| 2010/0063232 | A1 | 3/2010 | Nagai et al. |

FOREIGN PATENT DOCUMENTS

| | | |
|---|---|---|
| EP | 1897869 A1 | 3/2008 |
| EP | 2080774 A2 * | 7/2009 |
| EP | 2 112 554 A2 | 10/2009 |
| JP | 9-325497 A | 12/1997 |
| JP | 2004-2252 A | 1/2004 |
| JP | 2004-115630 A | 4/2004 |
| JP | 2005-8766 A | 1/2005 |
| JP | 2007-197718 A | 8/2007 |
| JP | 2008-102383 A | 5/2008 |
| JP | 2008-133448 A | 6/2008 |
| JP | 2008-304590 A | 12/2008 |
| WO | WO 2006/121096 A1 | 11/2006 |
| WO | WO 2008/056795 A1 | 5/2008 |

OTHER PUBLICATIONS

European Search Report dated Oct. 14, 2010, issued in corresponding European Patent Application No. 10251008.8.

\* cited by examiner

*Primary Examiner* — John Chu
(74) *Attorney, Agent, or Firm* — Birch, Stewart, Kolasch & Birch, LLP

(57) ABSTRACT

A chemically amplified resist composition comprises a polymer comprising units having polarity to impart adhesion and acid labile units adapted to turn alkali soluble under the action of acid. The polymer comprises recurring units having formula (1) wherein $R^1$ is H, F, $CH_3$ or $CF_3$, Rf is H, F, $CF_3$ or $CF_2CF_3$, A is a divalent hydrocarbon group, $R^2$, $R^3$ and $R^4$ are alkyl, alkenyl, oxoalkyl, aryl, aralkyl or aryloxoalkyl. Recurring units containing an aromatic ring structure are present in an amount ≧60 mol % and the recurring units having formula (1) are present in an amount <5 mol %.

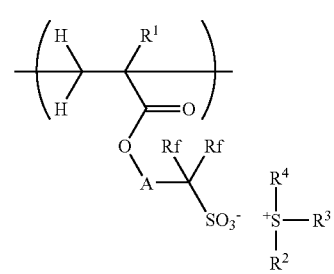

(1)

15 Claims, No Drawings

CHEMICALLY AMPLIFIED RESIST COMPOSITION AND PATTERN FORMING PROCESS

CROSS-REFERENCE TO RELATED APPLICATION

This non-provisional application claims priority under 35 U.S.C. §119(a) on Patent Application No. 2009-130020 filed in Japan on May 29, 2009, the entire contents of which are hereby incorporated by reference.

TECHNICAL FIELD

This invention generally relates to a chemically amplified resist composition and a resist pattern forming process. The chemically amplified resist composition, especially chemically amplified positive resist composition is sensitive to high-energy radiation such as UV, deep-UV, EUV, X-ray, γ-ray, synchrotron radiation, and electron beam (EB), and especially suited for use in the exposure step of irradiating high-energy radiation beam, typically EB or deep-UV, and adapted for microfabrication of semiconductor devices and photomasks.

BACKGROUND ART

To meet the recent demand for higher integration in integrated circuits, pattern formation to a finer feature size is required. Acid-catalyzed chemically amplified resist compositions are most often used in forming resist patterns with a feature size of 0.2 μm or less. High-energy radiation such as UV, deep UV or electron beam (EB) is used as the light source for exposure of these resist compositions. In particular, while EB lithography is utilized as the ultra-fine microfabrication technique, it is also indispensable in processing a photomask blank to form a photomask for use in semiconductor device fabrication.

In general, the EB lithography is by writing an image with EB, without using a mask. In the case of positive resist, those regions of a resist film other than the regions to be retained are successively irradiated with EB having a minute area. The operation of successively scanning all finely divided regions on the process surface takes a long time as compared with full wafer exposure through a photomask. In order to avoid any decline of throughput, the resist film must be highly sensitive. Because of the long image-writing time, there is a likelihood of a difference arising between the initially written portion and the later written portion. Thus the stability with time of exposed regions in vacuum is one of important performance requirements. One of the important applications of chemically amplified resist material resides in processing of mask blanks. Some mask blanks have a surface material that can have an impact on the pattern profile of the overlying resist, such as a film of a chromium compound, typically chromium oxide deposited on a photomask substrate. For high resolution and profile retention after etching, it is one important performance factor to maintain the pattern profile of resist film rectangular independent of the type of substrate.

The control of resist sensitivity and pattern profile as mentioned above has been improved by a proper selection and combination of resist material-constituting components and processing conditions. One problem to be improved is the diffusion of acid that largely affects the resolution of a chemically amplified resist material. In processing of photomasks, it is required that the profile of a resist pattern formed as above do not change with a lapse of time from the end of exposure to post-exposure baking. The major cause of such a change with time is diffusion of an acid generated upon exposure. The problem of acid diffusion has been widely studied not only in the field of photomask processing, but also in the field of general resist materials because it has a significant impact on sensitivity and resolution.

In particular, Patent Document 1 discloses that a sulfonic acid generated upon exposure is incorporated into a resin for use in resist material for inhibiting acid diffusion. This control method is attractive since it relies on a mechanism different from the control method using a base. Various improvements have been made on this method to comply with the demand of forming finer size patterns. Patent Document 2 is a useful example of achieving an improvement in acid strength.

CITATION LIST

Patent Document 1: JP-A H09-325497
Patent Document 2: JP-A 2008-133448 (U.S. Pat. No. 7,569,326)
Patent Document 3: JP-A 2007-197718
Patent Document 4: WO 2008/56795
    Patent Document 5: WO 2006/121096
    (US 2009069521, EP 1897869)
Patent Document 6: JP-A 2008-102383
Patent Document 7: JP-A 2008-304590
Patent Document 8: JP-A 2004-115630
Patent Document 9: JP-A 2005-008766

DISCLOSURE OF INVENTION

Polymers comprising a major proportion of aromatic ring structure having an acidic side chain, for example, polyhydroxystyrene have been widely used in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography because they offer high etching resistance.

In an attempt to apply the technology of Patent Document 2 to resist pattern formation on a photomask blank comprising a chromium compound at the outermost surface, the inventors found some drawbacks of a resist material comprising a polymer containing on a side chain a sulfonic acid sulfonium salt having a fluorinated alkyl chain, that is, a side chain capable of acid generation. While dry etching with oxygen-containing chlorine gas is used in processing a chromium compound film, the dry etching conditions pose a relatively heavy load on the overlying resist film. Thus the polymer used in the resist material is desired to contain as much as possible units having aromatic ring structure. Nevertheless, when the polymer is modified by increasing the ratio of aromatic ring structure-containing units and incorporating side chains capable of acid generation, there is an increased likelihood of pattern stripping or pattern collapse.

An object of the invention is to provide a chemically amplified resist composition comprising a polymer having a high ratio of aromatic ring structure-containing constituent units and containing on a side chain a sulfonic acid sulfonium salt having a fluorinated alkyl chain, that is, a side chain capable of acid generation, which composition is effective when used in forming a resist pattern required to have high etching resistance, and offers a minimized likelihood of pattern stripping or pattern collapse even when used in forming a resist pattern on a substrate which is difficult to form a resist pattern, typically on the surface of a chromium compound film. Another object is to provide a resist pattern forming process using the resist composition.

The inventors have found that a polymer comprising a major proportion of aromatic ring structure-containing recurring units as represented by the general formulae (2) to (5) below is improved by incorporating a sulfonium salt having the general formula (1) therein as recurring units in an amount of less than 5 mol % based on the entire recurring units, particularly when the polymer contains a hydroxystyrene structure; and that the polymer is free of insoluble precipitates which would otherwise form during polymerization, has a drastically increased solubility in resist solvents, and is capable of consistently forming a pattern even on a processable substrate having on its surface a chromium base or analogous material which tends to invite pattern stripping or pattern collapse upon pattern formation.

In one aspect, the invention provides a chemically amplified resist composition comprising a polymer comprising units having a sufficient polarity in their molecule to impart adhesion to the polymer and units protected with an acid labile group and adapted to turn alkali soluble under the action of acid. The polymer further comprises recurring units having the general formula (1):

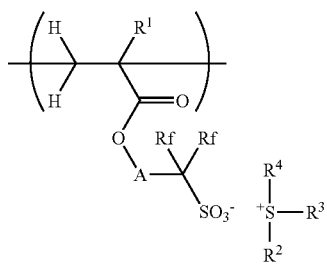

(1)

wherein $R^1$ is each independently hydrogen, fluorine, methyl or trifluoromethyl, Rf is each independently hydrogen, fluorine, trifluoromethyl or pentafluoroethyl, not all Rf are hydrogen, A is a divalent $C_1$-$C_{10}$ hydrocarbon group in which some or all hydrogen atoms may be substituted by fluorine atoms, or some methylene may be substituted by oxygen, $R^2$, $R^3$ and $R^4$ are each independently a substituted or unsubstituted straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom. Recurring units containing an aromatic ring structure are present in an amount of at least 60 mol % and the recurring units having formula (1) are present in an amount of less than 5 mol %, based on the entire recurring units of the polymer.

In a preferred embodiment, the units having a sufficient polarity in their molecule to impart adhesion to the polymer have the general formula (2):

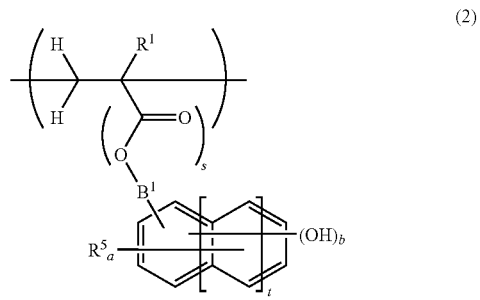

(2)

wherein s is each independently 0 or 1, t is each independently an integer of 0 to 2, $R^5$ is each independently hydrogen or a $C_1$-$C_6$ alkyl group, $B^1$ is a single bond or a $C_1$-$C_{10}$ alkylene group which may be separated by an ether bond, a is an integer of 0 to 3, and b is an integer of 1 to 3.

In a preferred embodiment, the units protected with an acid labile group and adapted to turn alkali soluble under the action of acid have the general formula (3):

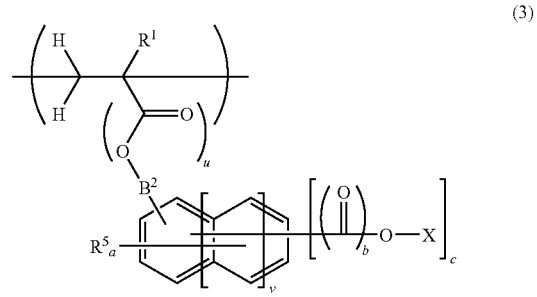

(3)

wherein u is 0 or 1, v is an integer of 0 to 2, $R^5$ is each independently hydrogen or a $C_1$-$C_6$ alkyl group, $B^2$ is a single bond or a $C_1$-$C_{10}$ alkylene group which may be separated by an ether bond, a is an integer of 0 to 3, b is 0 or 1, c is an integer of 1 to 3, in the case of c=1, X is an acid labile group, and in the case of c=2 or 3, X is hydrogen or an acid labile group, at least one X being an acid labile group.

In a preferred embodiment, the polymer further comprises units having the general formula (4) and/or (5):

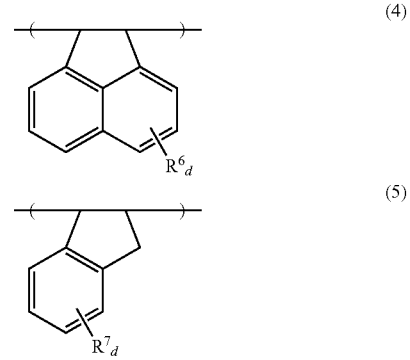

wherein d is an integer of 0 to 4, $R^6$ is each independently hydrogen, an optionally halogenated $C_1$-$C_6$ alkyl or primary or secondary alkoxy group, or an optionally halogenated $C_1$-$C_7$ alkylcarbonyloxy group, $R^7$ is each independently hydrogen, hydroxyl, $C_1$-$C_7$ alkylcarbonyloxy group, $C_1$-$C_6$ alkyl or alkoxy group, or halogenated alkyl or alkoxy group.

In another aspect, the invention provides a process for forming a resist pattern, comprising the steps of applying the chemically amplified resist composition defined above onto a processable substrate to form a resist film, exposing the resist film to a pattern of high-energy radiation, and developing the exposed resist film with an alkaline developer to form a resist pattern.

Typically the high-energy radiation is EUV or EB. In a preferred embodiment, the processable substrate comprises an outermost surface layer of chromium-containing material. The processable substrate is typically a photomask blank.

Advantageous Effects Of Invention

Using a chemically amplified resist composition comprising a polymer comprising a major proportion of aromatic ring structure-containing constituent units and units having on a side chain a sulfonic acid sulfonium salt having a fluorinated alkyl chain, i.e., a side chain capable of acid generation, a pattern can be formed even on a substrate which is difficult to form a resist pattern, typically on the surface of a chromium compound film. The resulting pattern is unsusceptible to stripping or collapse. The resist composition is effective in forming a resist pattern which is required to have high etch resistance.

DESCRIPTION OF THE PREFERRED EMBODIMENT

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer."

The polymer used in the resist composition of the invention is defined as comprising units having a sufficient polarity in their molecule to impart adhesion to the polymer and units protected with an acid labile group and adapted to turn alkali soluble under the action of acid, and further comprising recurring units having the general formula (1).

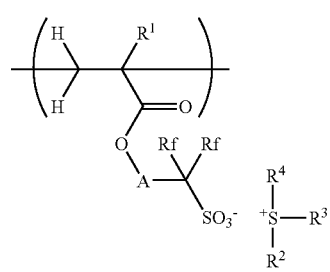

(1)

Herein $R^1$ is each independently hydrogen, fluorine, methyl or trifluoromethyl. Rf which may be the same or different is hydrogen, fluorine, trifluoromethyl or pentafluoroethyl, and not all Rf are hydrogen. The linker A is a divalent $C_1$-$C_{10}$ hydrocarbon group in which some or all hydrogen atoms may be substituted by fluorine atoms, or some methylene may be substituted by oxygen. $R^2$, $R^3$ and $R^4$ are each independently a substituted or unsubstituted straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom. In the polymer, the content of recurring units containing aromatic ring structure is at least 60 mol % and the content of the recurring units having formula (1) is less than 5 mol %, based on the entire recurring units.

The content of the aromatic ring structure-containing recurring units is preferably at least 70 mol %, and more preferably at least 85 mol %, and all units other than units of formula (1) may have an aromatic ring structure. A high content of aromatic ring structure ensures that the resulting resist pattern has high etch resistance. Since the content of the recurring units having formula (1) is less than 5 mol %, preferably up to 4 mol %, it becomes possible to form a resist pattern even on a substrate which tends to invite pattern stripping, the resulting resist pattern being highly reliable because of a least likelihood of pattern stripping. When the content of the recurring units having formula (1) is at least 0.5 mol %, preferably at least 1.5 mol %, the polymer may display a desired sensitivity as well as a low diffusion effect of the acid generator bound thereto.

The unit of formula (1) is a constituent unit capable of generating a sulfonic acid group bound to the polymer upon exposure to high-energy radiation. Since the relevant unit has at least one fluorine, trifluoromethyl or pentafluoroethyl group bonded to the carbon atom to which the sulfur atom of sulfonic acid is bonded, the acid generated upon receipt of high energy exhibits a strong acidity. While the linker "A" is a divalent $C_1$-$C_{10}$ hydrocarbon group, typically straight, branched or cyclic alkylene group, which may be substituted with fluorine or oxygen, preferred examples thereof are shown below by structural formulae (depicted as formula (1) with the sulfonium cation being omitted).

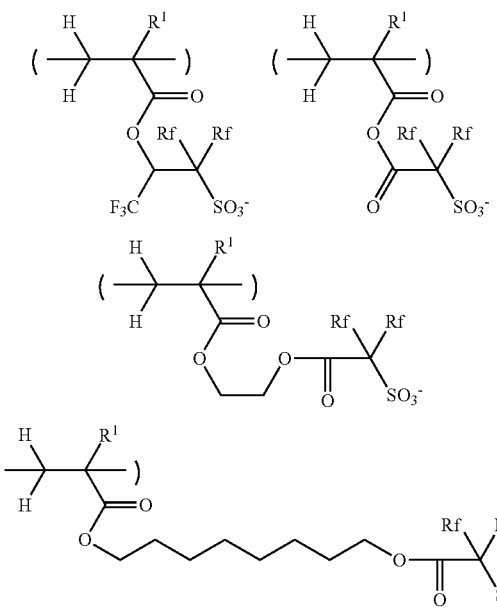

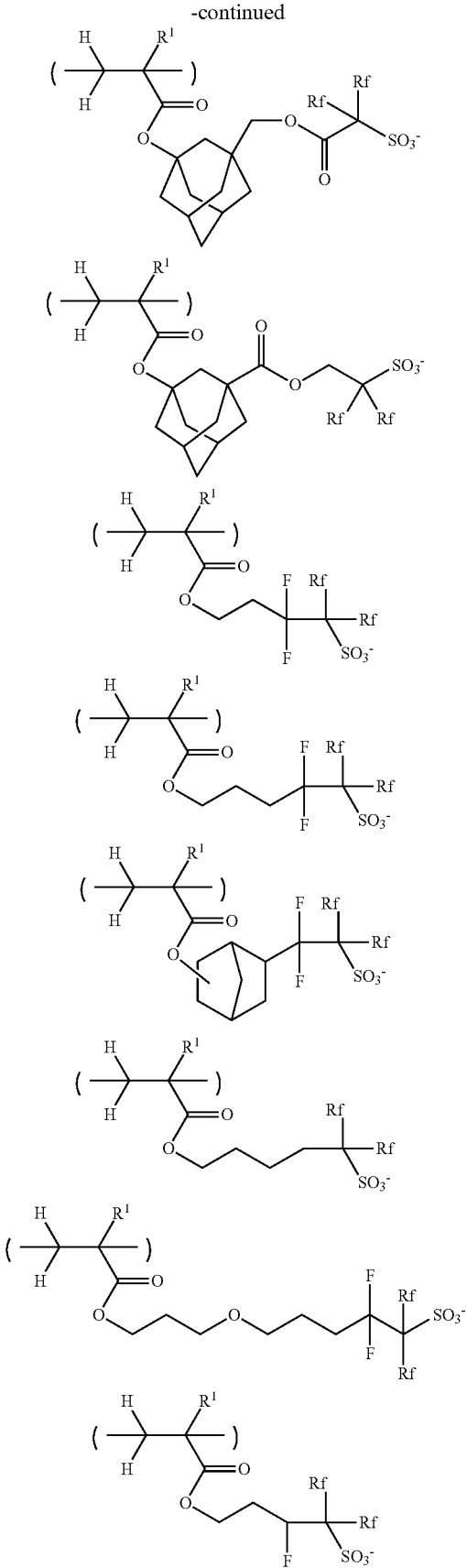

Further, reference may be made to Patent Documents 3, 4 and 5.

In formula (1), $R^2$, $R^3$ and $R^4$ are each independently a substituted or unsubstituted straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom in the formula.

Specifically, suitable alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl, and thienyl; alkoxyphenyl groups such as 4-hydroxyphenyl, 4-methoxyphenyl, 3-methoxyphenyl, 2-methoxyphenyl, 4-ethoxyphenyl, 4-tert-butoxyphenyl, and 3-tert-butoxyphenyl; alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. In the event that any two or more of $R^2$, $R^3$ and $R^4$ bond together to form a cyclic structure with the sulfur atom, exemplary cyclic structures are as shown below.

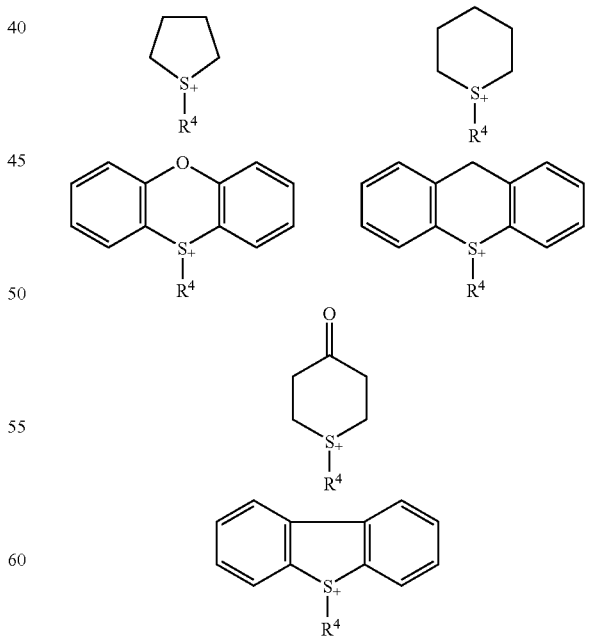

Note that $R^4$ is as defined above.

Exemplary sulfonium cations include triphenylsulfonium, 4-hydroxyphenyldiphenylsulfonium, bis(4-hydroxyphenyl)

phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, (4-n-hexyloxy-3,5-dimethylphenyl)diphenylsulfonium, dimethyl(2-naphthyl)sulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, diphenyl-2-thienylsulfonium, 4-n-butoxynaphtyl-1-thiacyclopentanium, 2-n-butoxynaphthyl-1-thiacyclopentanium, 4-methoxynaphthyl-1-thiacyclopentanium, and 2-methoxynaphthyl-1-thiacyclopentanium. Inter alia, preferred are triphenylsulfonium, 4-tert-butylphenyldiphenylsulfonium, 4-tert-butoxyphenyldiphenylsulfonium, tris(4-tert-butylphenyl)sulfonium, tris(4-tert-butoxyphenyl)sulfonium, and dimethylphenylsulfonium.

Of the recurring units having formula (1), those units having formula (1a) are preferred.

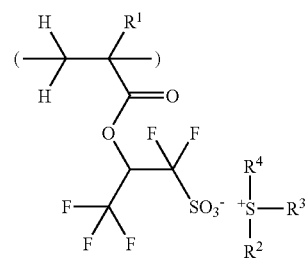
(1a)

Herein $R^1$ to $R^4$ are as defined above.

Illustrative examples of the recurring units having formula (1) are shown below.

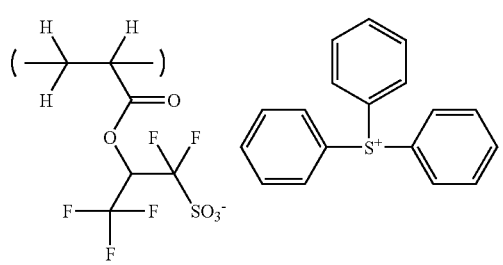

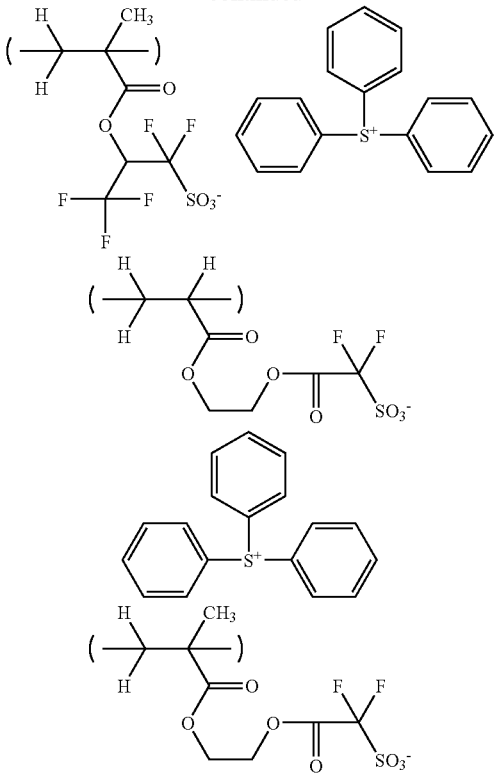

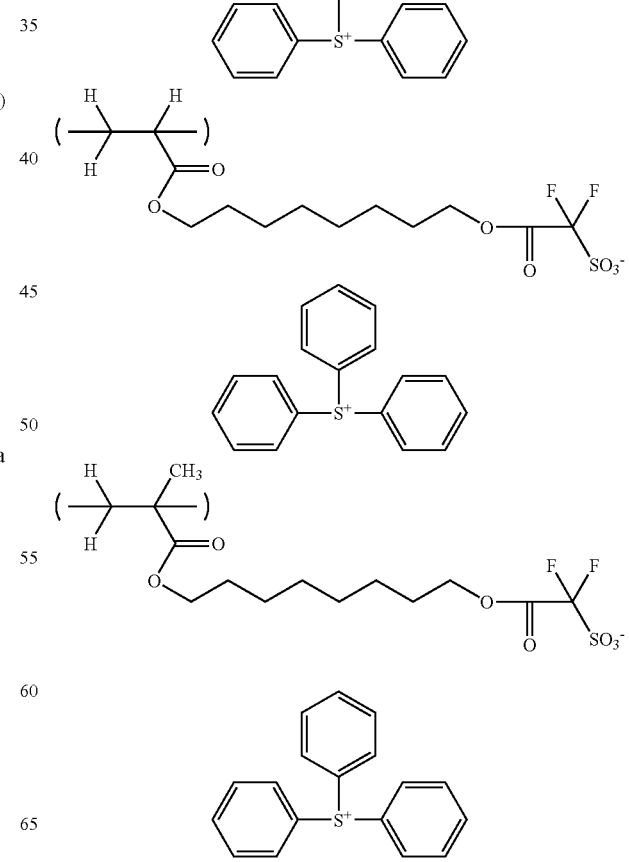

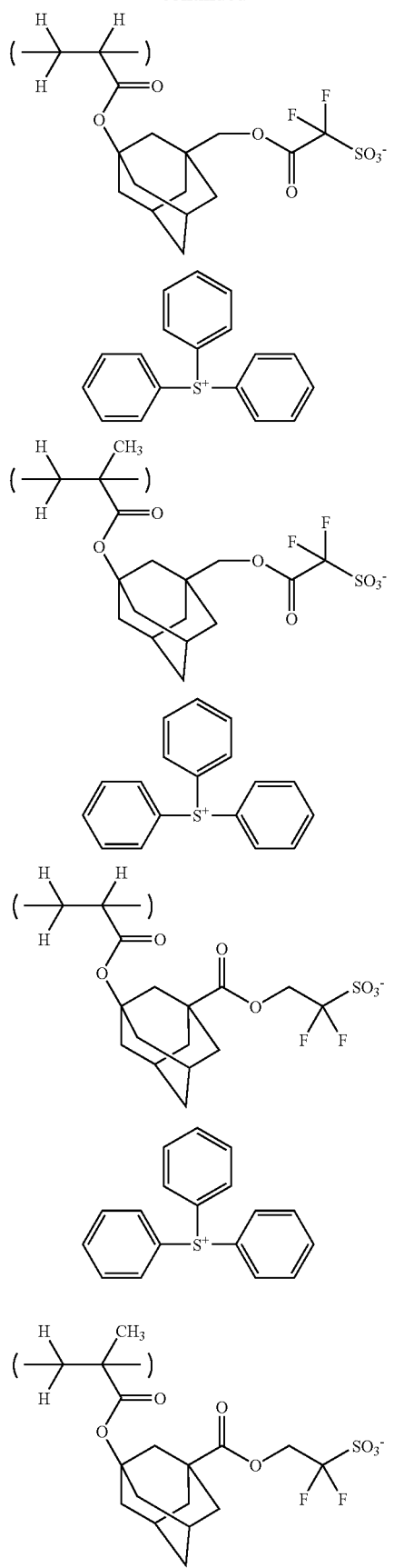
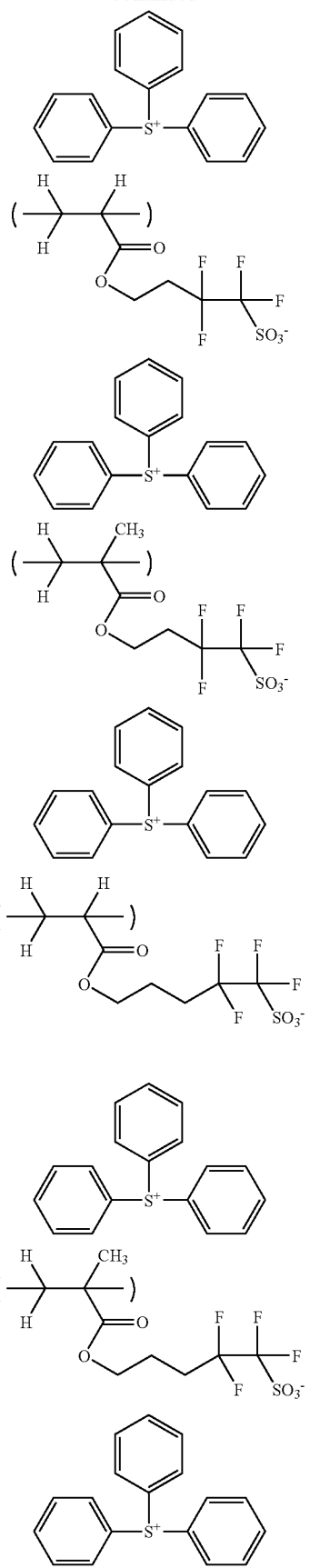

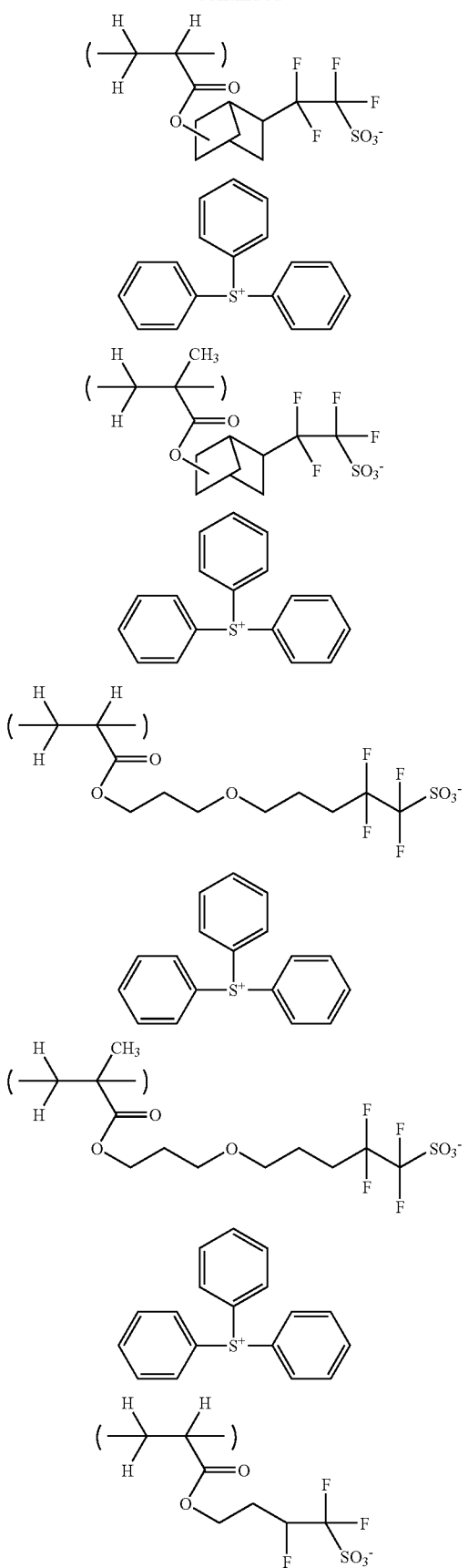
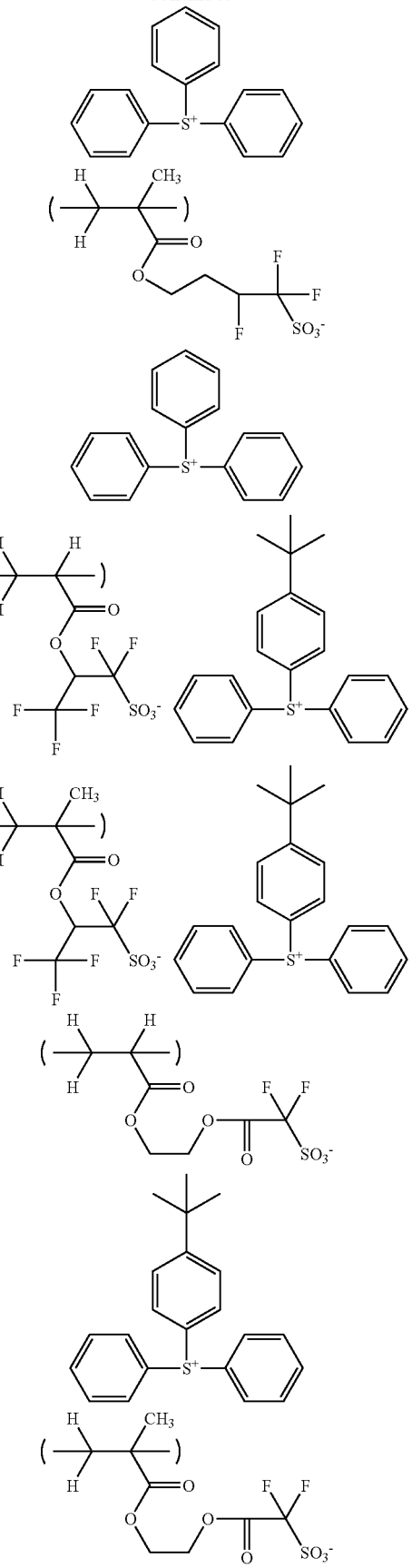

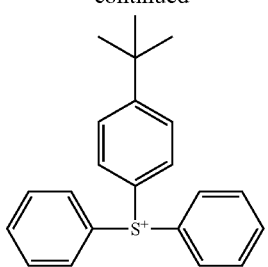
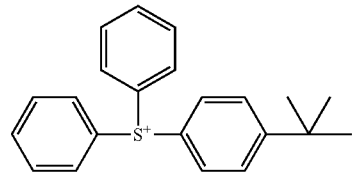
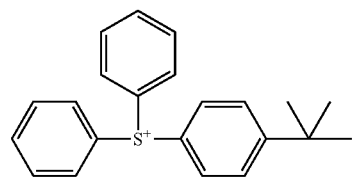
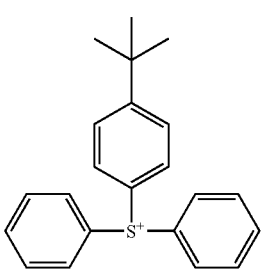
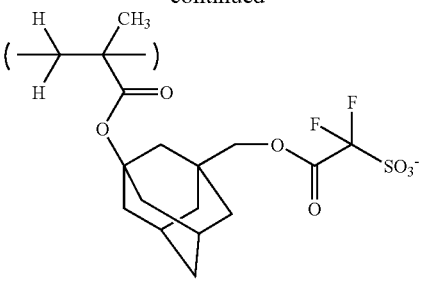

-continued
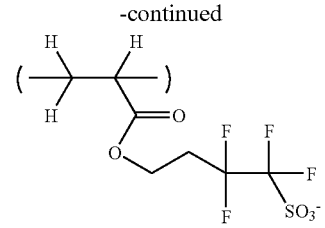
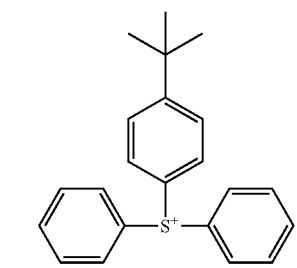
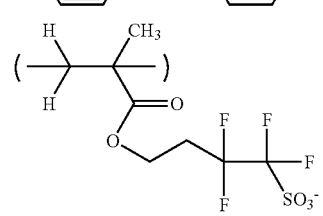
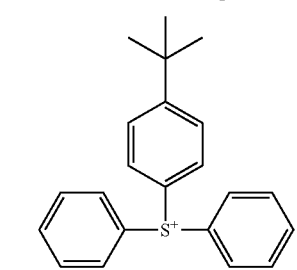
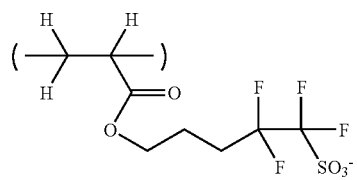
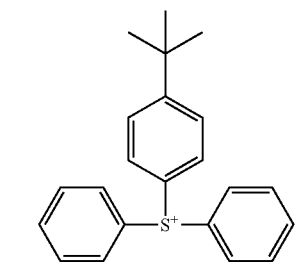
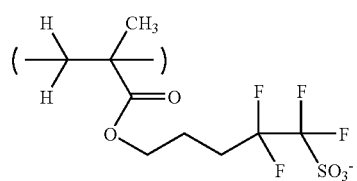
-continued
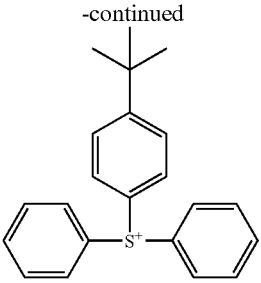
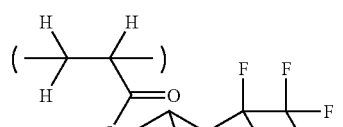
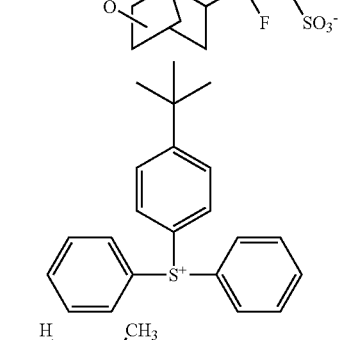
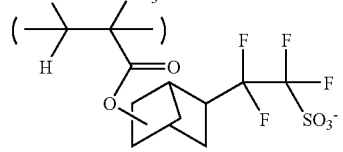
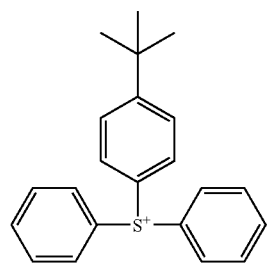
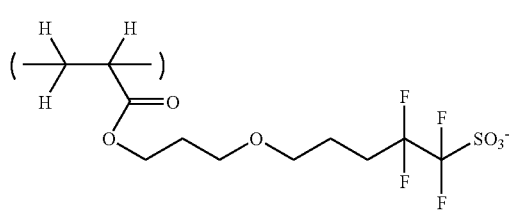
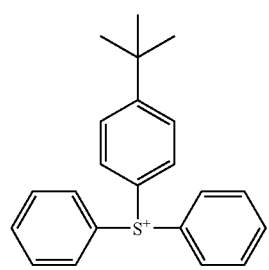

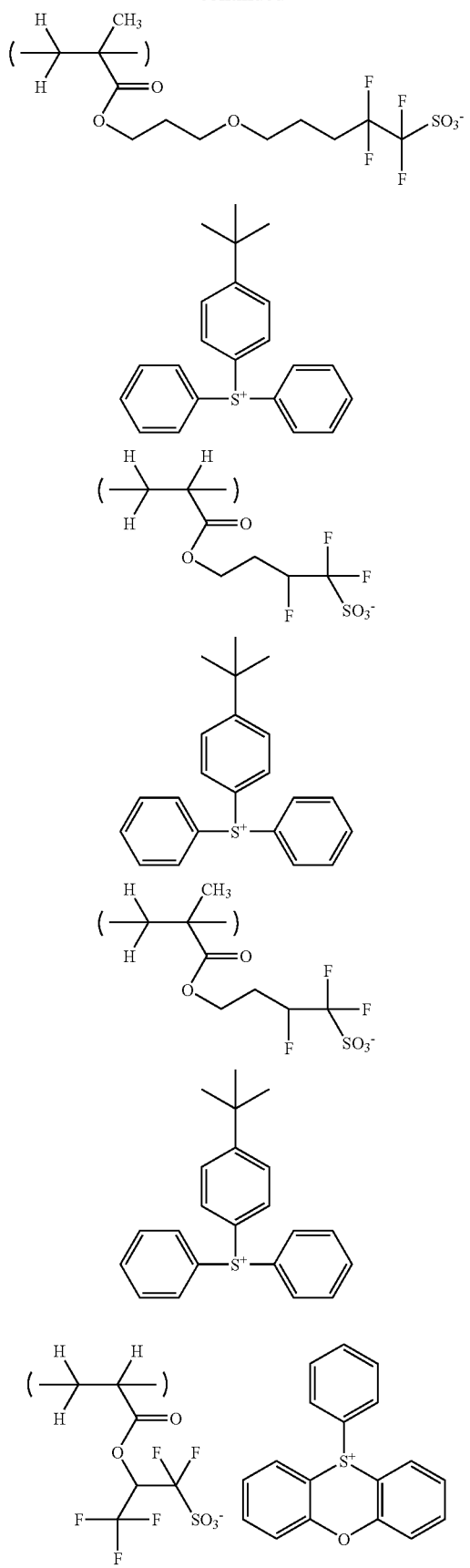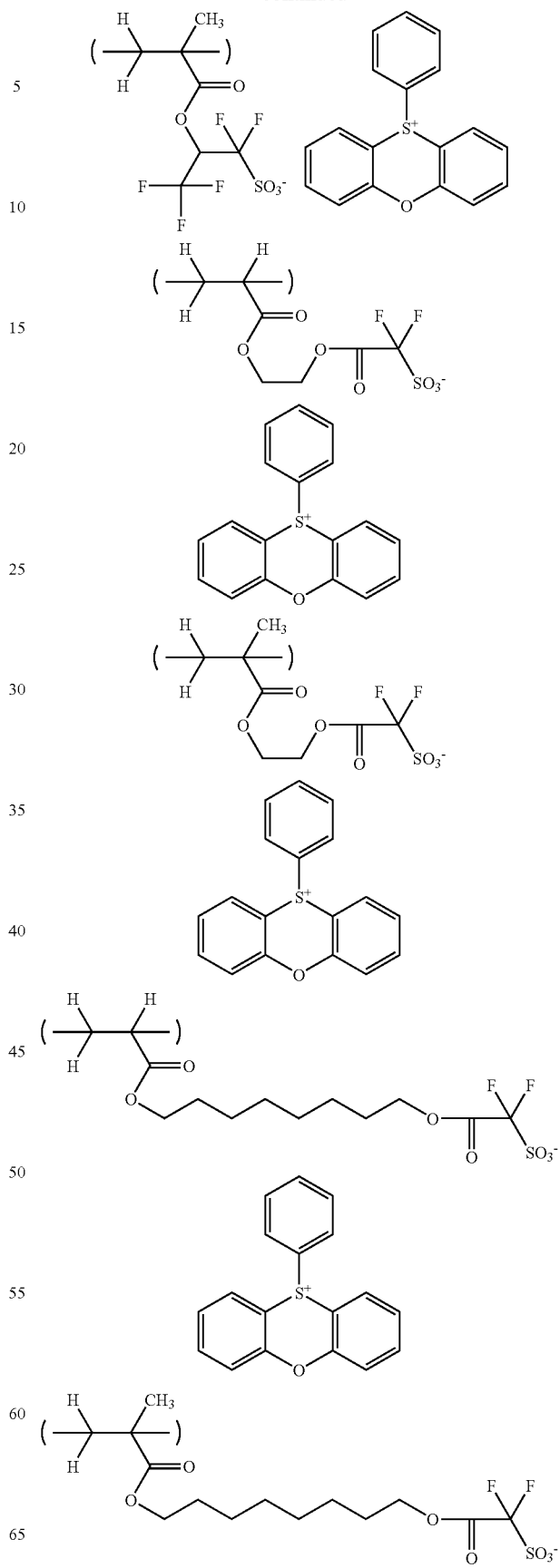

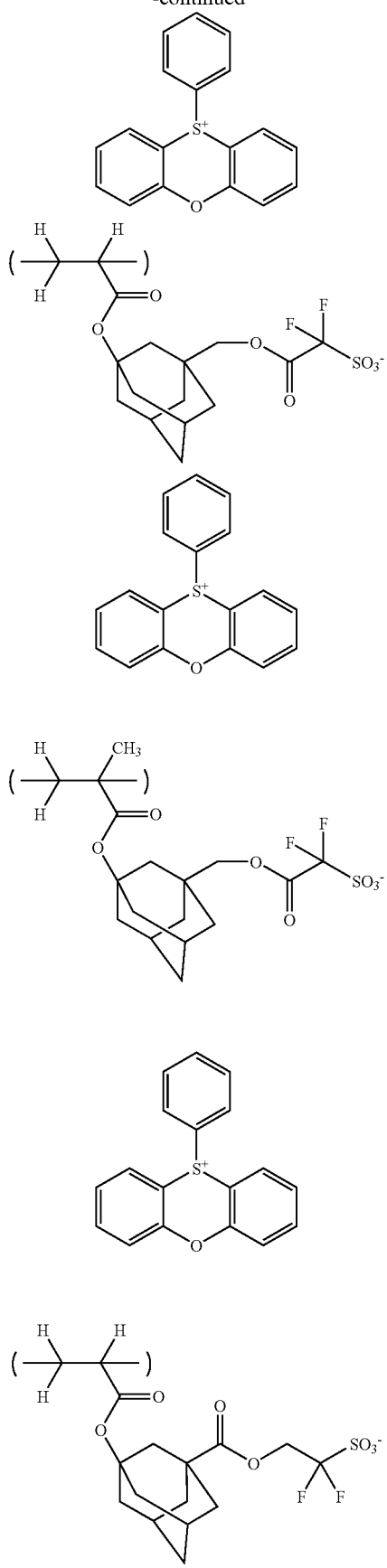
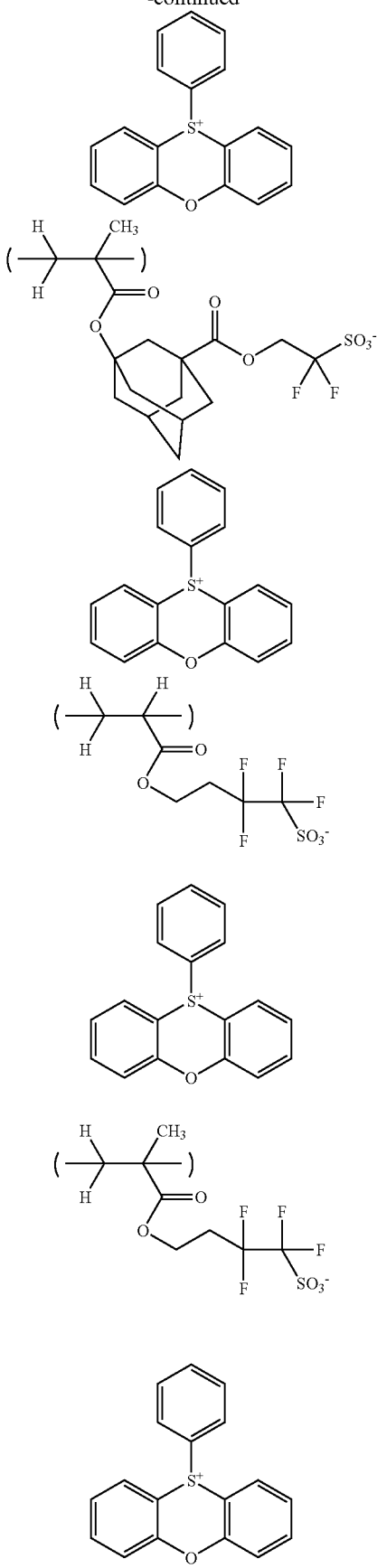

-continued
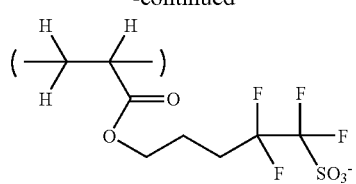
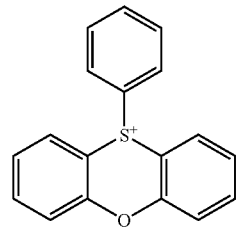
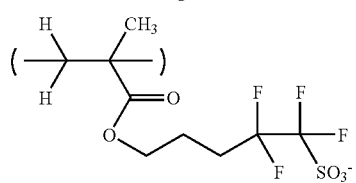
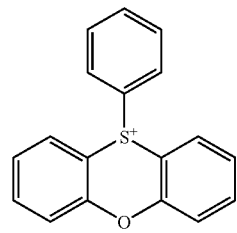
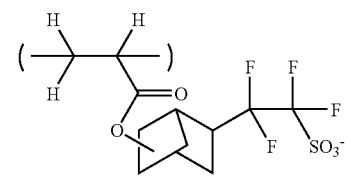
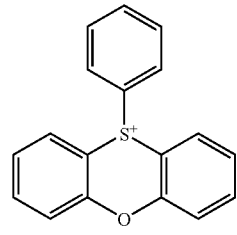
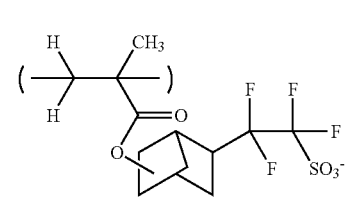
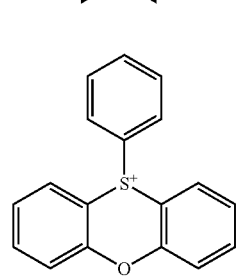
-continued
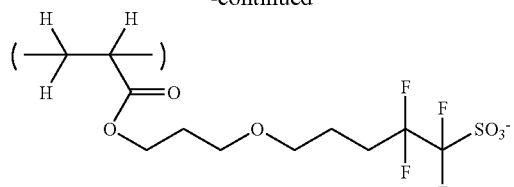
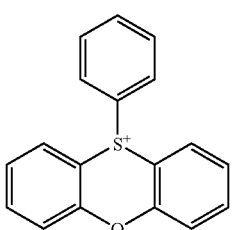
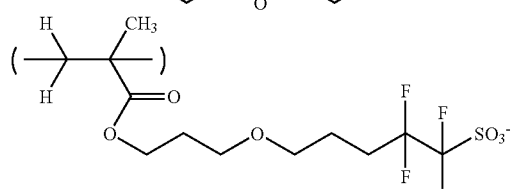
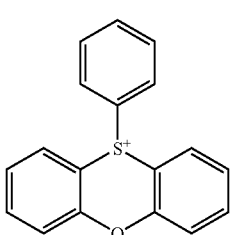
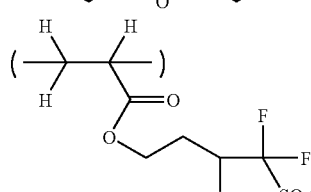
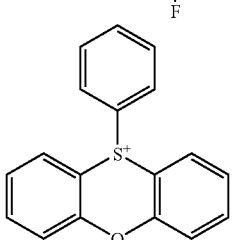
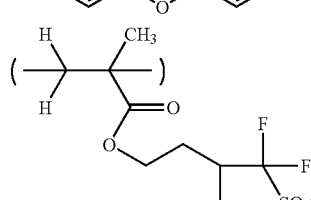
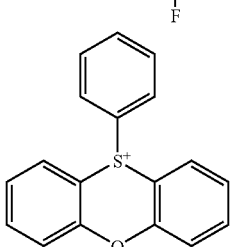

The sulfonium salts having a polymerizable anion used in formula (1) may be synthesized in accordance with the teachings of Patent Documents 2 to 5.

As mentioned above, the polymer used in the resist composition comprises units having a sufficient polarity in their molecule to impart adhesion to the polymer. A variety of units having such a function are known in the art and include units having a phenolic hydroxyl group, units having a lactone structure, and units having an alcoholic hydroxyl group. Any well-known units may be used herein although the recurring units incorporated in the polymer in a major proportion are preferably selected from those units having an aromatic ring structure as mentioned above.

The units having a sufficient polarity in their molecule to impart adhesion to the polymer are typically units having the general formula (2).

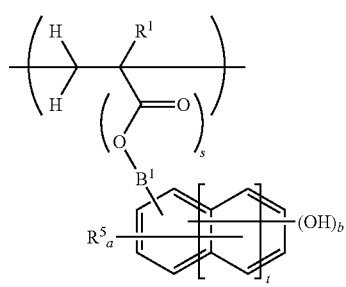

(2)

Herein s is each independently 0 or 1, t is each independently an integer of 0 to 2, $R^5$ is each independently hydrogen or a $C_1$-$C_6$ alkyl group, $B^1$ is a single bond or a $C_1$-$C_{10}$ alkylene group which may be separated by an ether bond, a is an integer of 0 to 3, and b is an integer of 1 to 3. The moiety —CO—O—$B^1$— is designated linker.

Of the recurring units having formula (2), those recurring units without the linker are units derived from monomers having an unsubstituted or 1-substituted vinyl group bonded to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units having the linker are derived from vinyl monomers having a carbonyl group substituted thereon, as typified by (meth)acrylic acid esters. Illustrative examples of recurring units having the linker $B^1$ are shown below.

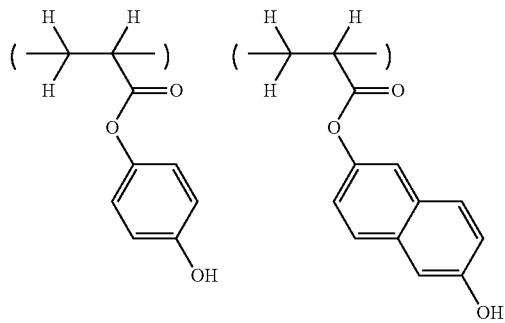

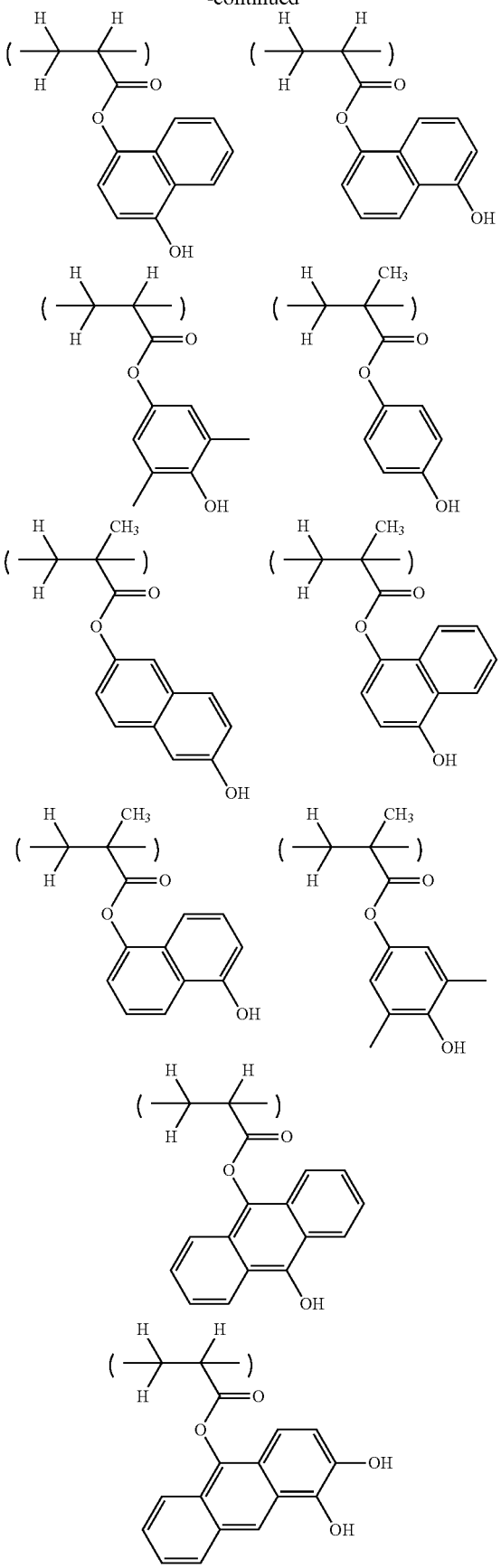

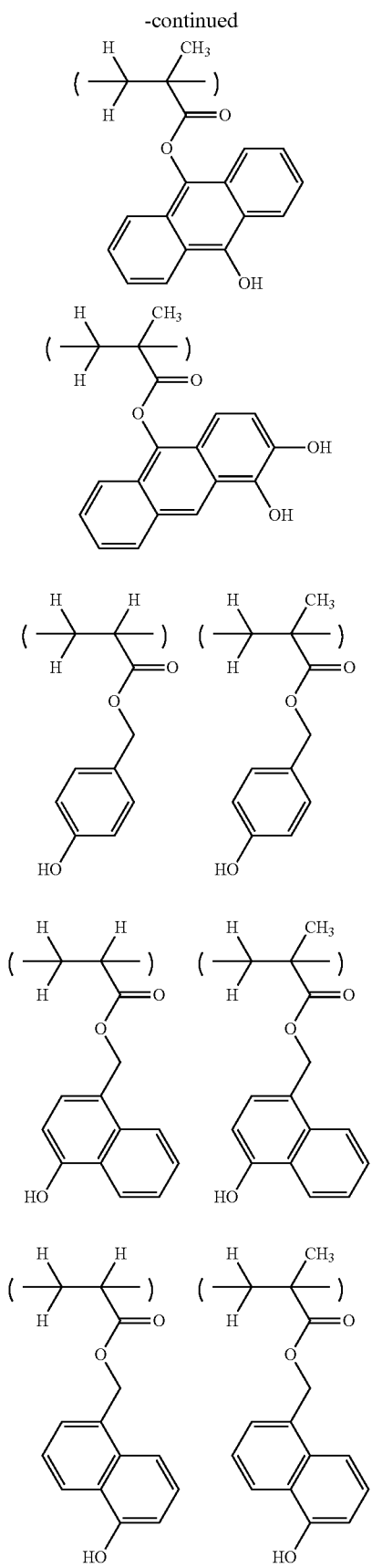

There may be used adhesion-imparting units other than the adhesion-imparting recurring units having an aromatic ring structure therein. Suitable other adhesion-imparting units include those of the general formulae (6), (7), and (8).

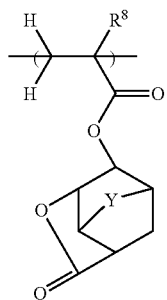

(6)

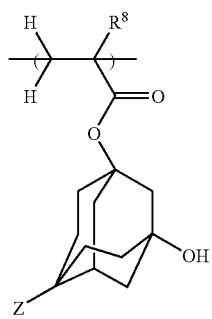

(7)

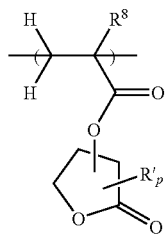

(8)

Herein $R^8$ is hydrogen, methyl or trifluoromethyl, Y is an oxygen atom or methylene group, Z is hydrogen or hydroxyl, R' is a $C_1$-$C_4$ alkyl group, and p is an integer of 0 to 3. The content of other adhesion-imparting units is preferably limited to a range of up to 10 mol % based on the entire recurring units of the polymer because the other adhesion-imparting units may detract from etch resistance when used as main adhesion-imparting units.

The units capable of imparting adhesion to the polymer may be of one type or a combination of plural types and incorporated in a range of 30 to 80 mol % based on the entire recurring units of the polymer. It is noted that where units of the general formula (4) and/or (5) capable of imparting higher etch resistance to the polymer are used, as will be described later, and these units have a phenolic hydroxyl group as a substituent group, the content of adhesion-imparting units plus etch resistance-improving units falls within the range.

As used in the polymer, the units protected with an acid labile group and adapted to turn alkali soluble under the action of acid are most preferably units having the general formula (3).

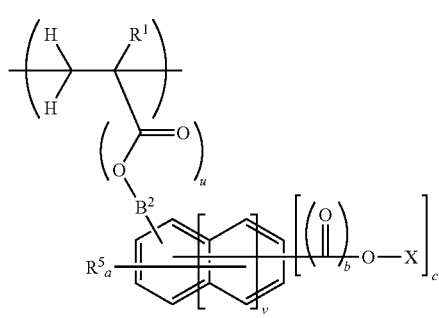

(3)

Herein u is 0 or 1, v is an integer of 0 to 2, $R^5$ is each independently hydrogen or a $C_1$-$C_6$ alkyl group, $B^2$ is a single bond or a $C_1$-$C_{10}$ alkylene group which may be separated by an ether bond, a is an integer of 0 to 3, b is 0 or 1, and c is an integer of 1 to 3. In the case of c=1, X is an acid labile group. In the case of c=2 or 3, X is hydrogen or an acid labile group, at least one X being an acid labile group.

The unit of formula (3) corresponds to a form of the unit of formula (2) in which at least one phenolic hydroxyl group substituting on an aromatic ring is replaced by an acid labile group, or in which a phenolic hydroxyl group is replaced by a carboxyl group and the resultant carboxylic acid is protected with an acid labile group. Generally the acid labile group used herein may be any of many well-known acid labile groups which are used in conventional chemically amplified resist compositions and which are eliminatable with the aid of acid to give an acidic group.

Independent of whether the phenolic hydroxyl group or the carboxyl group is protected, it is preferred to select a tertiary alkyl group as the acid labile group for protection because even when a fine size pattern having a line width of up to 45 nm, for example, is formed from a thin resist film having a thickness of 10 to 100 nm, the pattern is minimized in edge roughness (phenomenon that the pattern edge becomes of irregular shape). The tertiary alkyl groups used herein are preferably those of 4 to 18 carbon atoms because the monomers for polymerization are typically recovered by distillation. Suitable alkyl substituent groups on the tertiary carbon of the tertiary alkyl group include straight, branched or cyclic alkyl groups of 1 to 15 carbon atoms which may contain, in part, an oxygen-containing functional group such as an ether bond or carbonyl group. The substituent groups may bond together to form a ring.

Preferred substituent groups on the tertiary carbon of the tertiary alkyl group include straight, branched or cyclic alkyl groups which may contain an oxygen-containing functional group while the alkyl substituent groups on the tertiary carbon may bond together to form a ring. Examples of the preferred substituent groups include methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, tetracyclo[4.4.0.1$^{2,5}$.1$^{7,10}$]dodecyl, and 3-oxo-1-cyclohexyl. Examples of the tertiary alkyl group include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

Also acetal groups having the general formula (9) are often utilized.

(9)

Herein $R^9$ is hydrogen or a straight, branched or cyclic $C_1$-$C_{10}$ alkyl group, and Y is a straight, branched or cyclic (inclusive of polycyclic) $C_1$-$C_{30}$ alkyl group. The acetal group is a useful alternative as the acid labile group capable of consistently forming a pattern which provides a rectangular interface between the pattern and the substrate. In particular, inclusion of a polycyclic alkyl group of 7 to 30 carbon atoms is preferred to gain a higher resolution. Where Y is a polycyclic alkyl group, it is preferred that a bond form between the secondary carbon of the polycyclic structure and the acetal oxygen. This is because in case of a bond on the tertiary carbon of the cyclic structure, the polymer becomes unstable, resulting in the resist composition lacking storage stability and detracting from resolution. Inversely, if the polycyclic structure bonds on the primary carbon via a straight alkyl group of at least one carbon atom, a glass transition temperature (Tg) of the polymer may be lowered, resulting in profile failure of the resist pattern formed by development.

Examples of the acetal group having formula (9) are given below.

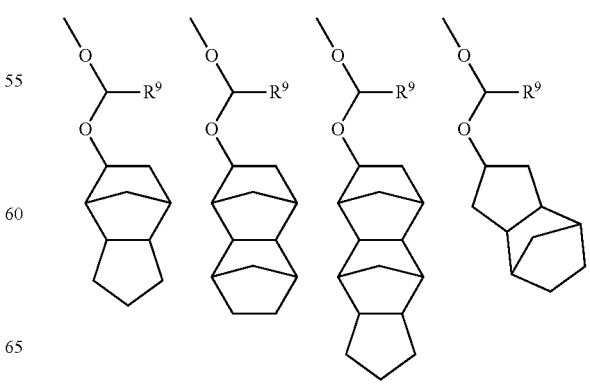

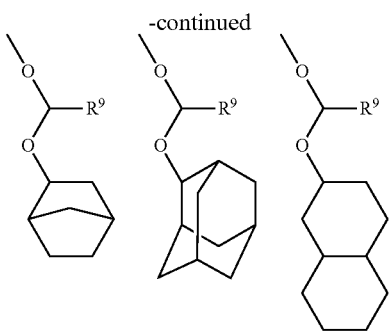

While $R^9$ is hydrogen or a straight, branched or cyclic $C_1$-$C_{10}$ alkyl group, an appropriate group may be selected for $R^9$ in accordance with the design of sensitivity of labile group to acid. For example, hydrogen is selected if the labile group is designed to be decomposable with strong acid while insuring relatively high stability; and a straight alkyl group is selected if the labile group is designed to provide high sensitivity to a pH change utilizing relatively high reactivity. In the event that the labile group is designed to undergo a substantial solubility change with decomposition by substituting a relatively bulky alkyl group at the end as above, a group in which the carbon bonding to the acetal carbon is secondary carbon is preferably selected for $R^9$, depending on a combination with an acid generator and basic compound to be compounded in the resist composition. Examples of the group $R^9$ having secondary carbon bonding to the acetal carbon include isopropyl, sec-butyl, cyclopentyl, and cyclohexyl.

An alternative that —CH$_2$COO— (tertiary alkyl group) is bonded to a phenolic hydroxyl group may be selected as the acid labile group. It is an acid labile group of exceptional structure in that it is not a protective group for a hydroxyl group. The tertiary alkyl group used herein may be the same as the foregoing tertiary alkyl group used for the protection of a phenolic hydroxyl group.

The units protected with an acid labile group and adapted to turn alkali soluble under the action of acid may be used alone or in a combination of plural types and incorporated in a range of 5 to 45 mol % base on the entire recurring units of the polymer.

To the polymer used in the resist composition, units having the general formula (4) and/or (5) may be added as main constituent units.

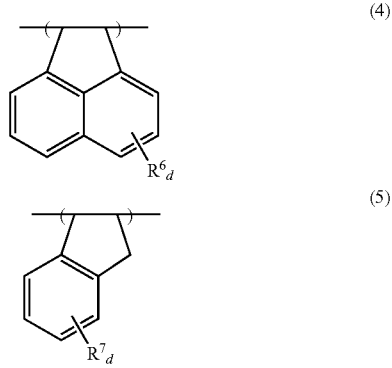

Herein d is an integer of 0 to 4, $R^6$ is each independently hydrogen, an optionally halogenated $C_1$-$C_6$ alkyl or primary or secondary alkoxy group, or an optionally halogenated $C_1$-$C_7$ alkylcarbonyloxy group, $R^7$ is each independently hydrogen, hydroxyl, $C_1$-$C_7$ alkylcarbonyloxy group, $C_1$-$C_6$ alkyl or alkoxy group, or halogenated alkyl or alkoxy group. Inclusion of the units of formula (4) or (5) as constituent units exerts, in addition to the etch resistance inherent to aromatic ring, an effect of enhancing resistance to EB irradiation during etching or pattern inspection operation, due to the addition of cyclic structure to the main chain.

The units that provide the main chain with a cyclic structure and improve etch resistance may be used alone or in a combination of plural types and incorporated in a range of at least 5 mol % base on the entire recurring units of the polymer in order to achieve the effect of improving etch resistance. If the functional group on units of formula (4) or (5) is such that these units become the units having a polarity to impart adhesion to the polymer or the units protected with an acid labile group and adapted to turn alkali soluble under the action of acid, then the content of units of formula (4) or (5) incorporated should be inclusive in the preferred ranges of the respective units. If units of formula (4) or (5) have no functional group, or if the functional group is otherwise, then the content of units of formula (4) or (5) incorporated is preferably up to 30 mol %. If the content of units of formula (4) or (5) in which the functional group is absent or otherwise is more than 30 mol %, then these units may cause development defects.

The resist composition comprising the polymer exhibits better characteristics when units of formulae (1) to (3) or formulae (1) to (5) account for at least 60 mol %, preferably at least 70 mol %, and more preferably at least 85 mol % based on the entire monomeric units of the polymer and thus serve as main constituent units. A polymer consisting of constituent units selected from formulae (1) to (5) has both high etch resistance and high resolution. Additional recurring units other than formulae (1) to (5) which can be incorporated into the polymer include (meth)acrylic acid ester units protected with ordinary acid labile groups, and (meth)acrylic acid ester units having adhesive groups of lactone or other structure, as described in Patent Document 2. Some properties of a resist film may be finely adjusted by incorporating such additional recurring units although the additional recurring units may be omitted.

The polymer comprising recurring units as described above may be obtained by any well-known methods, specifically by copolymerizing selected monomers while combining protection and deprotection reactions, if necessary. The copolymerization reaction is not particularly limited although radical, anionic or coordination polymerization is preferred. With respect to the polymerization methods, reference may be made to Patent Documents 2 to 5.

The polymer has a molecular weight, preferably a weight average molecular weight (Mw) of 2,000 to 50,000, more preferably 3,000 to 20,000, as measured by gel permeation chromatography (GPC) versus polystyrene standards. If Mw is less than 2,000, the polymer may be reduced in resolution and the pattern may be rounded at the top and degraded in line edge roughness (LER), as is well known in the art. On the other hand, if Mw is greater than the necessity, the LER tends to increase, depending on the pattern to be resolved. Particularly when a pattern having a line width of up to 100 nm is to be formed, the polymer is preferably controlled to a Mw of 20,000 or less. It is noted that the GPC measurement generally uses tetrahydrofuran (THF) solvent. Some polymers within the scope of the invention are not dissolvable in THF, and in this event, GPC measurement is made in dimethylformamide (DMF) solvent having up to 100 mM of lithium bromide added thereto.

The polymer should preferably be narrow disperse as demonstrated by a dispersity (Mw/Mn) of 1.0 to 2.0, more preferably 1.0 to 1.8. If the dispersity is wider, the pattern after development may have foreign particles deposited thereon, or the pattern profile may be degraded.

The resist composition of the invention may exert resist performance when a solvent is added to the polymer. If necessary, a basic compound, acid generator, another polymer, surfactant and other components may be added.

In fact, the basic compound is an essential component in chemically amplified resist compositions wherein an acid generating unit is not incorporated into a polymer. The basic compound is preferably added to the resist composition of the invention as well in order to provide a high resolution or to adjust to a proper sensitivity. An appropriate amount of the basic compound added is 0.01 to 5 parts, more preferably 0.05 to 3 parts by weight per 100 parts by weight of the polymer. A choice may be made of numerous basic compounds which are known in the art as disclosed in Patent Documents 1 to 5. Known basic compounds include primary, secondary and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amides, imides, carbamates, and ammonium salts. Many examples of these compounds are described in Patent Document 2, and any of them may be used herein. Two or more basic compounds may be selected and used in admixture. Preferred examples of the basic compound to be formulated include tris(2-(methoxymethoxy)ethyl)amine N-oxide, morpholine derivatives, and imidazole derivatives.

In a situation where a resist pattern is formed on a substrate which causes a phenomenon that a positive pattern becomes difficulty dissolvable at the interface with the substrate during pattern formation, namely the pattern takes a so-called footing profile, typically a substrate having a surface layer of chromium compound, the pattern profile may be improved when an amine compound, or amine oxide compound having a carboxyl group, but free of hydrogen in covalent bond with nitrogen serving as basic center (excluding an amine or amine oxide compound having nitrogen included in aromatic ring structure) is used.

The amine or amine oxide compounds having a carboxyl group, but free of hydrogen in covalent bond with nitrogen serving as basic center are preferably amine or amine oxide compounds having at least a carboxyl group, but free of hydrogen in covalent bond with nitrogen serving as basic center, represented by the general formulae (10) to (12).

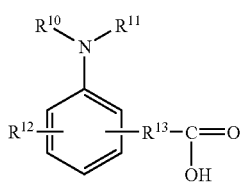
(10)

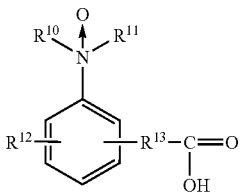
(11)

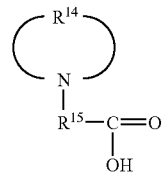
(12)

Herein $R^{10}$ and $R^{11}$ are independently a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl, or $C_2$-$C_{10}$ alkylthioalkyl group, or $R^{10}$ and $R^{11}$ may bond together to form a cyclic structure with the nitrogen atom to which they are attached. $R^{12}$ is hydrogen, a straight, branched or cyclic $C_1$-$C_{20}$ alkyl group, $C_6$-$C_{20}$ aryl group, $C_7$-$C_{20}$ aralkyl group, $C_2$-$C_{10}$ hydroxyalkyl group, $C_2$-$C_{10}$ alkoxyalkyl group, $C_2$-$C_{10}$ acyloxyalkyl, $C_2$-$C_{10}$ alkylthioalkyl group, or halogen. $R^{13}$ is a single bond, a straight, branched or cyclic $C_1$-$C_{20}$ alkylene group, or $C_6$-$C_{20}$ arylene group. $R^{14}$ is an optionally substituted, straight or branched $C_2$-$C_{20}$ alkylene group, with the proviso that one or more carbonyl, ether, ester or sulfide group may intervene between carbon atoms of the alkylene group. $R^{15}$ is a straight, branched or cyclic $C_1$-$C_{20}$ alkylene group or $C_6$-$C_{20}$ arylene group.

Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_2$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and similar groups having alkyl isomers. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl. The foregoing groups are merely exemplary and not limitative.

Examples of the amine compound having a carboxyl group, but free of hydrogen in covalent bond with nitrogen serving as basic center represented by formula (10) include, but not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalic acid, 3-diethylamino-2-naphthalic acid, 3-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl)benzoic acid, and 2-(4-dibutylamino)-2-hydroxybenzoyl)benzoic acid.

Examples of the amine compound having a carboxyl group, but free of hydrogen in covalent bond with nitrogen serving as basic center represented by formula (11) include, but not limited thereto, oxidized forms of the amine compounds exemplified above.

Examples of the amine compound having a carboxyl group, but free of hydrogen in covalent bond with nitrogen serving as basic center represented by formula (12) include, but not limited thereto, 1-piperidinepropionic acid, 1-piperidinebutyric acid, 1-piperidinemalic acid, 1-piperidinepyruvic acid, and 1-piperidinelactic acid.

Some compounds having the amine oxide structure of formula (11) are existing compounds while some are novel. The compound having the amine oxide structure may be prepared by an optimum method selected in accordance with a particular structure. Exemplary methods include a method utilizing oxidative reaction using a nitrogen-containing compound as an oxidizing agent, and a method utilizing oxidative reaction in a solution of a nitrogen-containing compound diluted with aqueous hydrogen peroxide, but are not limited thereto. The preparation method is described in detail.

The preparation of a nitrogen-containing alcohol compound by esterification reaction is illustrated by the following reaction scheme, for example, and this method is applicable to the synthesis of compounds having formula (11).

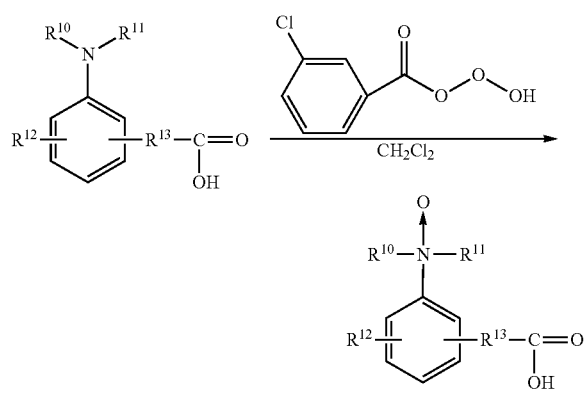

Herein $R^{10}$ to $R^{13}$ are as defined above.

While the reaction in the above scheme is an oxidative reaction of an amine using an oxidizing agent (m-chloroperbenzoic acid), such reaction may also be performed using another oxidizing agent commonly used in oxidative reaction. After reaction, the reaction mixture may be purified by standard techniques such as distillation, chromatography and recrystallization. See Patent Document 6.

The resist composition of the invention is characterized by controlled acid diffusion in that the recurring units having formula (1) in the polymer are capable of generating an acid upon exposure to high-energy radiation, and the acid thus generated is bound to the polymer so that acid diffusion is controlled. In this sense, essentially another acid generator need not be added to the resist composition. However, when it is desired to increase sensitivity or to improve roughness or the like, another acid generator may be added as an auxiliary in a small amount. If the other acid generator is added in excess, the effect assigned to the polymer-bound acid generator may be lost. Then the amount of the other acid generator added should preferably be less than the molar equivalent based on the structure having formula (1) contained as recurring units in the polymer, and more preferably up to one half of the molar equivalent based on the structure having formula (1).

The other acid generator which is added separate from the polymer may be selected from well-known acid generators (examples of which are enumerated in Patent Documents 1 to 5), depending on desired properties to be tailored. Specifically the amount of the other acid generator added is preferably less than 15 parts, more preferably up to 10 parts by weight per 100 parts by weight of the polymer because addition of at least 15 pbw of the other acid generator can detract from the effect of the polymer-bound acid generator. The addition amount is preferably up to 5 pbw particularly when the other acid generator is to generate a sulfonic acid having a low molecular weight, for example, a sulfonic acid of up to 6 carbon atoms.

In the resist composition, the polymer comprising units having formula (1) and units preferably selected from formulae (2) to (5) may be used alone or in admixture of two or more types. Besides, there may be added a polymer comprising units capable of acid generation having a different structure from formula (1), a polymer free of acid generating units like formula (1) and adapted to turn alkali soluble under the action of acid, or a polymer which is alkali soluble independent of reaction with acid. As disclosed in Patent Document 2, examples of the additional polymer include (i) poly(meth)acrylic acid derivatives, (ii) norbornene derivative/maleic anhydride copolymers, (iii) hydrogenated products of ring-opening metathesis polymerization (ROMP) polymers, (iv) vinyl ether/maleic anhydride/(meth)acrylic acid derivative copolymers, and (v) polyhydroxystyrene derivatives. These polymers are well known for use in conventional chemically amplified positive resist compositions and belong to the class of polymers adapted to turn alkali soluble under the action of acid. Also an alkali soluble polymer may be added for the purposes of improving pattern profile and controlling formation of residues upon development. Examples of the polymer used for such purposes include a number of polymers well known for use in conventional chemically amplified negative resist compositions. Furthermore, fluorine-containing polymers as disclosed in Patent Document 7 may be added.

When the inventive polymer and another polymer free of units capable of acid generation are used in admixture, the mixing ratio of the inventive polymer is preferably at least 30% by weight and more preferably at least 50% by weight of the mixture. If the ratio of the inventive polymer is less than the range, defects may form during development. It is preferred that the inventive polymer and the other polymer be mixed such that those units having an aromatic ring structure may account for at least 60 mol % of the entire recurring units of the polymers combined. The other polymer is not limited to one type and a mixture of two or more polymers may be added. The use of plural polymers allows for easy adjustment of resist properties.

Optionally, the resist composition may further comprise a surfactant which is commonly used for improving the coating characteristics. A number of surfactants are known as enumerated in Patent Documents 1 to 7 and a choice may be made in accordance with such teaching. The surfactant may be added in an amount of up to 2 parts, and preferably up to 1 part by weight, per 100 parts by weight of the base resin in the resist composition. When used, the amount of surfactant added is preferably at least 0.01 pbw.

A pattern may be formed from the resist composition of the invention, using any well-known lithography. In general, the composition is applied onto a substrate for integrated circuitry fabrication (e.g., Si, $SiO_2$, SiN, SiON, TiN, WSi, BPSG, SOG, organic antireflective coating, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.05 to 2.0 μm thick. A patterning mask having the desired pattern is then placed over the resist film, and the film exposed through the mask to high-energy radiation such as deep-UV, excimer laser or x-ray in a dose of 1 to 200 $mJ/cm^2$, and preferably 10 to 100 $mJ/cm^2$. Alternatively, pattern formation may be performed by writing with an electron beam directly (not through a mask). Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PEB) on a hot plate at 60 to 150° C. for 1 to 5 minutes, and preferably at 80 to 140° C. for 1 to 3 minutes. Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. These steps result in the formation of the desired pattern on the substrate.

The resist composition of the invention is effective in forming a resist pattern which is required to have high etch resistance and to experience a minimal change of line width even when the time from exposure to PEB is prolonged. The resist composition is advantageously applied to a processable substrate to form a pattern thereon, especially to a substrate having a surface layer of material which is difficult for the resist pattern to adhere so that pattern stripping or collapse is likely to occur, and specifically a substrate having a chromium compound film containing chromium and one or more light elements of oxygen, nitrogen and carbon deposited by sputtering.

EXAMPLE

Examples and Comparative Examples are given below by way of illustration and not by way of limitation. In Examples, Me stands for methyl. The compositional ratio of a copolymer is a molar ratio. A weight average molecular weight (Mw) is measured by gel permeation chromatography (GPC) versus polystyrene standards.

Synthesis Example

Sulfonium salts having a polymerizable anion within the scope of the invention were synthesized according to the following formulation.

Synthesis Example 1

Synthesis of Triphenylsulfonium Chloride

Diphenyl sulfoxide, 40 g (0.2 mole), was dissolved in 400 g of dichloromethane, which was stirred under ice cooling. At a temperature below 20° C., 65 g (0.6 mole) of trimethylsilyl chloride was added dropwise to the solution, which was allowed to mature for 30 minutes at the temperature. Then, a Grignard reagent which had been prepared from 14.6 g (0.6 mole) of metallic magnesium, 67.5 g (0.6 mole) of chlorobenzene and 168 g of tetrahydrofuran (THF) was added dropwise at a temperature below 20° C. The reaction solution was allowed to mature for one hour, after which 50 g of water at a temperature below 20° C. was added to quench the reaction. To this solution, 150 g of water, 10 g of 12N hydrochloric acid, and 200 g of diethyl ether were further added. The water layer was separated and washed with 100 g of diethyl ether, yielding an aqueous solution of triphenylsulfonium chloride. The compound in aqueous solution form was used in the subsequent reaction without further isolation.

Synthesis Example 2

Synthesis of 4-tert-butylphenyldiphenylsulfonium bromide

The target compound was obtained by following the procedure of Synthesis Example 1 aside from using 4-tert-butylbromobenzene instead of the chlorobenzene in Synthesis Example 1 and increasing the amount of water for extraction.

Synthesis Example 3

Synthesis of 4-tert-butoxyphenyldiphenylsulfonium chloride

The target compound was obtained by following the procedure of Synthesis Example 1 aside from using 4-tert-butoxychlorobenzene instead of the chlorobenzene in Synthesis Example 1, using dichloromethane containing 5 wt % of triethylamine as the solvent, and increasing the amount of water for extraction.

Synthesis Example 4

Synthesis of tris(4-methylphenyl)sulfonium chloride

The target compound was obtained by following the procedure of Synthesis Example 1 aside from using bis(4-methylphenyl) sulfoxide instead of the diphenyl sulfoxide and 4-chlorotoluene instead of the chlorobenzene in Synthesis Example 1, and increasing the amount of water for extraction.

Synthesis Example 5

Synthesis of tris(4-tert-butylphenyl)sulfonium bromide

The target compound was obtained by following the procedure of Synthesis Example 1 aside from using bis(4-tert-butylphenyl) sulfoxide instead of the diphenyl sulfoxide and 4-tert-butylbromobenzene instead of the chlorobenzene in Synthesis Example 1, and increasing the amount of water for extraction.

Synthesis Example 6

Synthesis of bis(4-tert-butylphenyl)iodonium hydrogen sulfate

A mixture of 84 g (0.5 mole) of tert-butylbenzene, 53 g (0.25 mole) of potassium iodate and 50 g of acetic anhydride was stirred under ice cooling. A mixture of 35 g of acetic anhydride and 95 g of conc. sulfuric acid was added dropwise thereto at a temperature below 30° C. The resulting solution was allowed to mature for 3 hours at room temperature and ice cooled again, after which 250 g of water was added dropwise to quench the reaction. The reaction solution was extracted with 400 g of dichloromethane. The organic layer was discolored by adding 6 g of sodium hydrogen sulfite. The organic layer was washed with 250 g of water three times. The washed organic layer was concentrated in vacuum, obtaining a crude target product. The product was used in the subsequent reaction without further purification.

Synthesis Example 7

Synthesis of Phenacyltetrahydrothiophenium Bromide 88.2 g (0.44 mole) of phenacyl bromide and 39.1 g (0.44 mole) of tetrahydrothiophene were dissolved in 220 g of nitromethane, which was stirred for 4 hours at room temperature. 800 g of water and 400 g of diethyl ether were added to the reaction solution whereupon the mixture separated into two layers. The aqueous layer was taken out, which was an aqueous solution of the target compound, phenacyltetrahydrothiophenium bromide.

Synthesis Example 8

Synthesis of Dimethylphenylsulfonium Hydrogen Sulfate

A mixture of 6.2 g (0.05 mole) of thioanisole and 6.9 g (0.055 mole) of dimethyl sulfate was stirred for 12 hours at room temperature. 100 g of water and 50 ml of diethyl ether were added to the reaction solution whereupon the mixture separated into two layers. The aqueous layer was taken out, which was an aqueous solution of the target compound, dimethylphenylsulfonium hydrogen sulfate.

Synthesis Example 9

Synthesis of phenoxathiin-S-oxide

To a solution of 100 g (0.5 mole) of phenoxathiin in 1,600 g of acetic acid, 48.5 g (0.5 mole) of 35% aqueous hydrogen peroxide solution was added dropwise at room temperature. The mixture was stirred for 7 days at room temperature. The reaction solution was poured into 3,000 g of water whereupon white crystals precipitated. The crystals were collected by filtration and vacuum dried, obtaining the target compound. White crystals, 90 g (yield 83%).

Synthesis Example 10

Synthesis of 10-phenylphenoxathiinium iodide

A solution of 40 g (0.18 mole) of phenoxathiin-S-oxide in 400 g of dichloromethane was stirred under ice cooling. To the solution, 65 g (0.6 mole) of trimethylsilyl chloride was added dropwise at a temperature below 20° C. The resulting solution was allowed to mature for 30 minutes at the temperature. Then, a Grignard reagent which had been prepared from 14.6 g (0.6 mole) of metallic magnesium, 67.5 g (0.6 mole) of chlorobenzene and 168 g of THF was added dropwise at a temperature below 20° C. The reaction solution was allowed to mature for one hour, after which 50 g of water at a temperature below 20° C. was added to quench the reaction. To this solution, 150 g of water, 10 g of 12N hydrochloric acid, and 200 g of diethyl ether were further added. The water layer was separated and washed with 100 g of diethyl ether, yielding an aqueous solution of triphenylsulfonium chloride. Sodium iodide was added to the solution for crystallization of a sulfonium salt. Crystals were filtered and dried, obtaining the target compound.

Synthesis Example 11

Synthesis of sodium 2-benzoyloxy-1,1,3,3,3-pentafluoro-propane-1-sulfonate

In 72 g of water was dispersed 10.0 g of 1,1,3,3,3-pentafluoro-2-propan-1-yl benzoate which had been synthesized by a standard method. To the dispersion, 12.0 g of sodium hydrogen sulfite and 1.24 g of benzoyl peroxide were added. Reaction took place at 85° C. for 65 hours. The reaction solution was allowed to cool down and then combined with toluene, followed by separatory operation to separate a water layer. A saturated sodium chloride aqueous solution was added thereto whereupon white crystals settled out. The crystals were collected by filtration, washed with a small volume of saturated sodium chloride aqueous solution, and dried in vacuum, obtaining the target compound, sodium 2-benzoyloxy-1,1,3,3,3-pentafluoropropane-1-sulfonate. White crystals, 5.85 g (yield 43%).

Synthesis Example 12

Synthesis of triphenylsulfonium 2-benzoyloxy-1,1,3,3,3-pentafluoropropane-1-sulfonate To 50 g of dichloromethane were added an amount (corresponding to 0.011 mole) of the triphenylsulfonium chloride aqueous solution of Synthesis Example 1 and 3.6 g (0.01 mole) of sodium 2-benzoyloxy-1,1,3,3,3-pantafluoro-propane-1-sulfonate synthesized in Synthesis Example 11, followed by stirring. The organic layer was separated and washed with 50 g of water three times. The organic layer was concentrated and 25 g of diethyl ether was added to the concentrate for crystallization. The crystals were filtered and dried, obtaining the target compound. White crystals, 4.5 g (yield 75%).

Synthesis Example 13

Synthesis of 10-phenylphenoxathiinium 2-benzoyloxy-1,1,3,3,3-pentafluoropropane-1-sulfonate In 300 g of methanol was dissolved 39.8 g (0.098 mole) of 10-phenylphenoxathiinium iodide synthesized in Synthesis Example 10. 13.1 g (0.049 mole) of lead carbonate and 39.6 g (0.11 mole) of sodium 2-benzoyloxy-1,1,3,3,3-pentafluoro-propane-1-sulfonate synthesized in Synthesis Example 11 were added to the solution, which was heated at 70° C. The solution was allowed to cool down, after which the precipitate was filtered, and the solvent layer was distilled under reduced pressure. The residue was combined with 500 g of dichloromethane and washed with 100 g of water, after which the solvent layer was again distilled under reduced pressure. Diisopropyl ether was added to the residue for crystallization. The crystals were filtered and dried, obtaining 43 g (yield 76%) of the target compound which was identified by NMR spectroscopy.

Synthesis Example 14

Synthesis of triphenylsulfonium 1,1,3,3,3-pentafluoro-2-hydroxypropane-1-sulfonate (PAG-1)

In 72 g of methanol was dissolved 34.4 g of triphenylsulfonium 2-benzoyloxy-1,1,3,3,3-pentafluoropropane-1-sulfonate synthesized in Synthesis Example 12. While the solution was stirred under ice cooling, 54.0 g of 5% sodium hydroxide solution was added dropwise at a temperature below 10° C. It was allowed to mature at the temperature for 4 hours. At a temperature below 10° C., 6.8 g of 12N hydrochloric acid was added to quench the reaction. The methanol was distilled off in vacuum, after which 270 g of dichloromethane was added to the residue. The organic layer was washed with 40 g of water three times, after which it was concentrated, and 60 g of diethyl ether was added to the concentrate for crystallization. The crystals were filtered and dried, obtaining the target compound. White crystals, 24.3 g (yield 85%).

Synthesis Examples 15 to 22

Target compounds were synthesized as in Synthesis Example 14 except that the onium salts prepared in Synthesis Examples 2 to 8 were used. The resulting onium salts PAG-2 to PAG-8 are shown below. Also a target compound was synthesized as in Synthesis Example 14 except that the onium salt prepared in Synthesis Example 13 was used. The resulting onium salt PAG-9 is shown below.

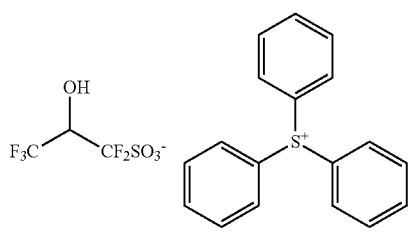

PAG-1

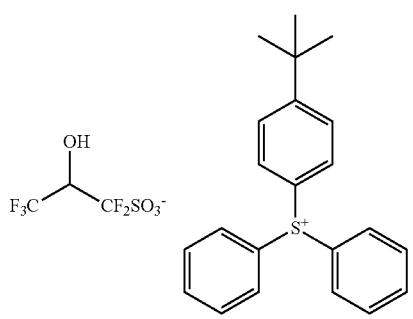

PAG-2

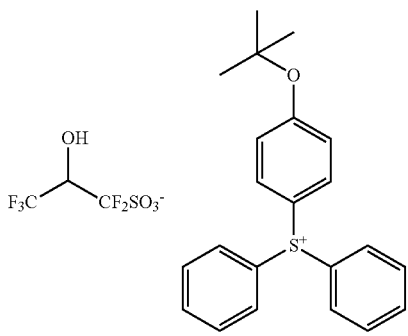

PAG-3

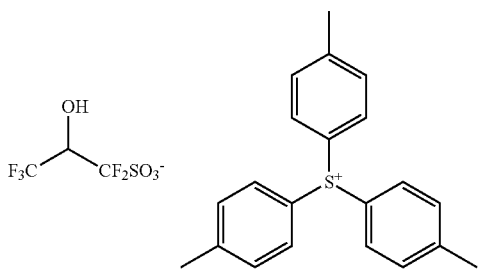

PAG-4

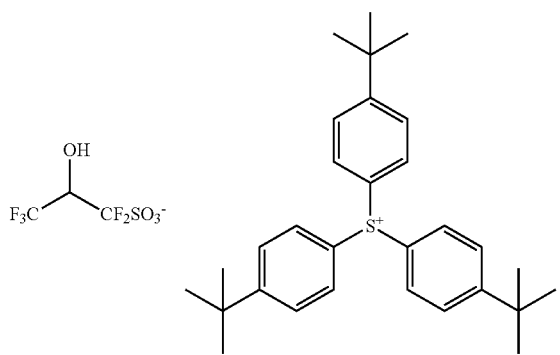

PAG-5

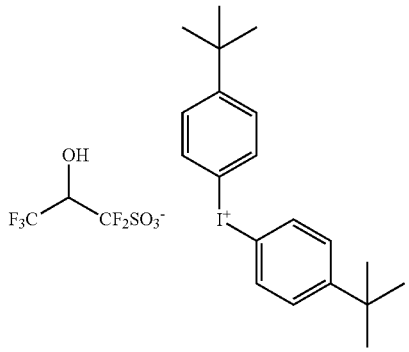

PAG-6

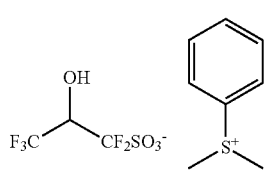

PAG-7

-continued

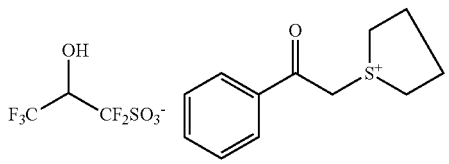
PAG-8

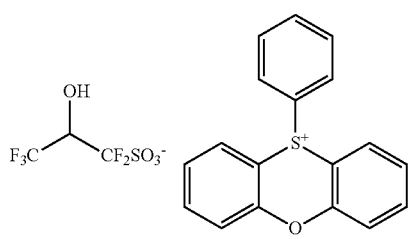
PAG-9

Synthesis Example 23

Synthesis of sodium 2-pivaloyloxy-1,1-difluoroethane-sulfonate (Anion Intermediate)

Pivalic acid chloride and 2-bromo-2,2-difluoroethanol were mixed in THF, and ice cooled. Triethylamine was added to the solution, after which standard separatory operation and solvent distillation were carried out to recover 2-bromo-2,2-difluoroethyl pivalate. It was converted to a sodium sulfinate with sodium dithionite and oxidized with hydrogen peroxide, obtaining sodium 2-pivaloyloxy-1,1-difluoroethane-sulfonate.

Synthesis of carboxylic acid ester is well known, and synthesis of sulfinic acid and sulfonic acid from alkyl halide is also well known. The latter is described, for example, in JP-A 2004-002252.

Synthesis Example 24

Synthesis of triphenylsulfonium 2-(pivaloyloxy)-1,1-difluoroethanesulfonate (PAG Intermediate 1)

In 700 g of dichloromethane and 400 g of water were dissolved 159 g (0.37 mole) of sodium 2-pivaloyloxy-1,1-difluoroethanesulfonate (purity 63%) and 132 g (0.34 mole) of triphenylsulfonium iodide. The organic layer was separated, washed with 200 g of water three times, and concentrated. Diethyl ether was added to the residue for recrystallization, obtaining the target compound. White crystals, 164 g (yield 95%).

Synthesis Example 25

Synthesis of triphenylsulfonium 1,1-difluoro-2-hydroxy-ethanesulfonate (PAG-10)

In 760 g of methanol was dissolved 243.5 g (0.48 mole) of triphenylsulfonium 2-pivaloyloxy-1,1-difluoroethane-sulfonate. To the solution under ice cooling, a solution of 40 g of sodium hydroxide in 120 g of water was added dropwise at a temperature below 5° C. It was allowed to mature at room temperature for 8 hours. At a temperature below 10° C., dilute hydrochloric acid (99.8 g of 12N hydrochloric acid in 200 g of water) was added to quench the reaction. The methanol was distilled off in vacuum, after which 1,000 g of dichloromethane was added to the residue. The organic layer was washed with 30 g of saturated saline three times. The organic layer was concentrated, and 1 L of diisopropyl ether was added to the concentrate for crystallization. The crystals were filtered and dried, obtaining the target compound. White crystals, 187 g (yield 78%).

Synthesis Examples 26 and 27

Target compounds were synthesized as in Synthesis Examples 24 and 25 except that the onium salts prepared in Synthesis Examples 2 and 10 were used. The resulting onium salts PAG-11 and PAG-12 are shown below.

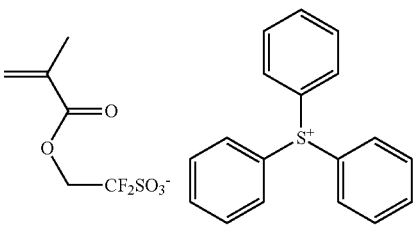
Monomer 10

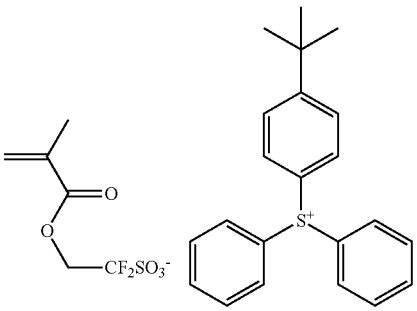
Monomer 11

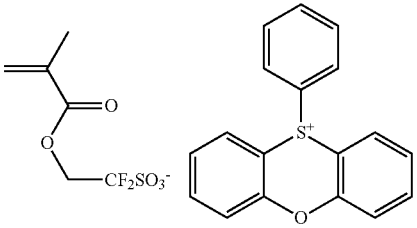
Monomer 12

Synthesis Example 28

Synthesis of triphenylsulfonium 1,1,3,3,3-pentafluoro-2-methacryloyloxypropane-1-sulfonate (Monomer 1)

In 200 g of dichloromethane was dissolved 49.0 g (0.1 mole) of triphenylsulfonium 1,1,3,3,3-pentafluoro-2-hydroxy-propane-1-sulfonate synthesized in Synthesis Example 14. 10.1 g (0.10 mole) of triethylamine and 2.4 g (0.2 mole) of N,N-dimethylaminopyridine were added to the solution, which was stirred under ice cooling. To the solution, 10.0 g (0.10 mole) of methacrylic anhydride was added dropwise at a temperature below 10° C. It was allowed to mature for 15 minutes and combined with dilute hydrochloric acid, followed by separatory operation. The organic layer was separated, washed three times with 200 g of water, and then concentrated. Diethyl ether was added to the concentrate for crystallization. The crystals were filtered, purified by silica gel column chromatography (elute: dichloromethane/methanol solvent mixture), recrystallized from diethyl ether again, filtered, and dried, obtaining the target compound. White crystals, 29 g (yield 51%).

Synthesis Examples 29 to 36

Synthesis of Monomers 2 to 9

Onium salts having a polymerizable anion were synthesized by following the procedure of Synthesis Example 28 except that the onium salts (PAG-2 to PAG-9) in Synthesis Examples 15 to 22 were used instead of the triphenylsulfonium 1,1,3,3,3-pentafluoro-2-hydroxypropane-1-sulfonate used in Synthesis Example 28.

Monomers 1 to 9 have the structural formulae shown below.

Monomer 1

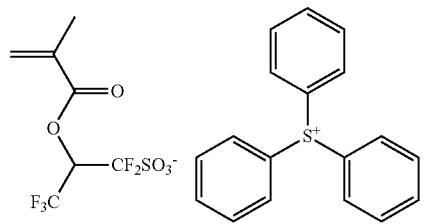

Monomer 2

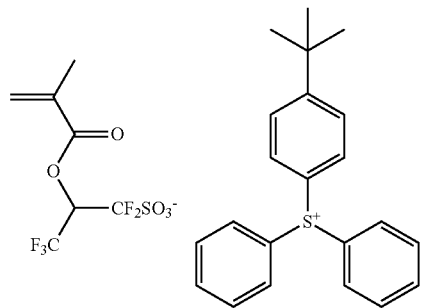

Monomer 3

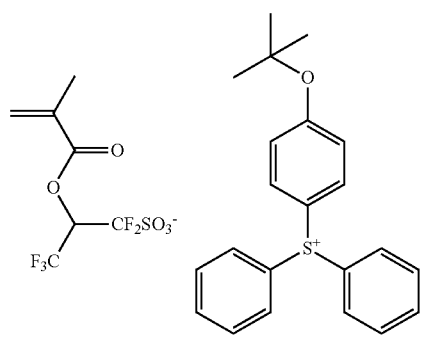

Monomer 4

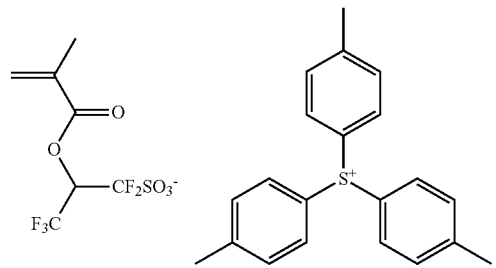

Monomer 5

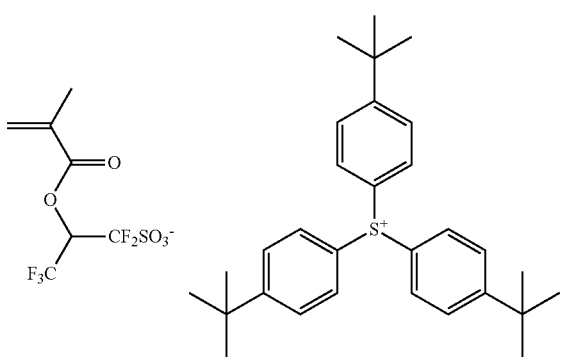

Monomer 6

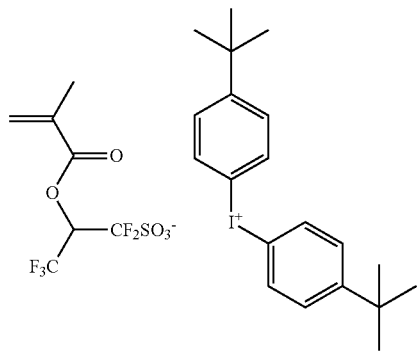

Monomer 7

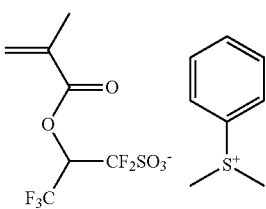

Monomer 8

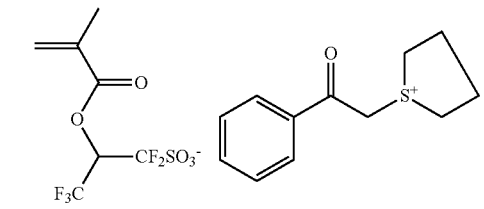

Monomer 9

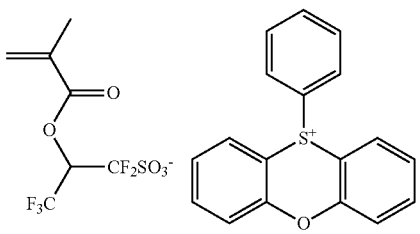

Synthesis Example 37

Synthesis of triphenylsulfonium 1,1-difluoro-2-methacryl-oyloxyethanesulfonate (Monomer 10)

Triphenylsulfonium 1,1-difluoro-2-hydroxyethane-sulfonate (purity 63%) was dissolved in a 5-fold weight of acetonitrile. One equivalent of triethylamine and 0.05 equivalent of 4-N,N-dimethylaminopyridine were added to the solution, which was cooled in an ice bath. At a temperature below 5° C., 1.1 equivalents of methacrylic anhydride was added dropwise to the solution, which was stirred for 2 hours at room temperature. Dilute hydrochloric acid was added to the reaction solution to turn it acidic, after which the solvent was distilled off in vacuum. Dichloromethane and water were added to the residue. The organic layer was taken out and washed with water, after which the solvent was distilled off in vacuum. Diethyl ether was added to the residue to effect reprecipitation for purification. The target compound was obtained as oily matter.

Synthesis Examples 38 and 39

Synthesis of Monomers 11 and 12

Onium salts having a polymerizable anion were synthesized by following the procedure of Synthesis Example 37 except that the onium salts (PAG-11 and 12) in Synthesis Examples 26 and 27 were used instead of the triphenylsulfonium 1,1-difluoro-2-hydroxyethanesulfonate used in Synthesis Example 37.

Monomers 10 to 12 have the structural formulae shown below.

Monomer 10

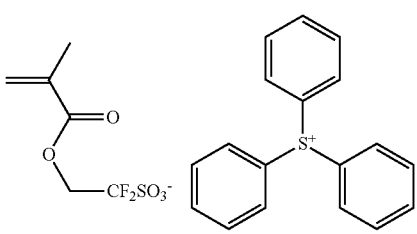

Monomer 11

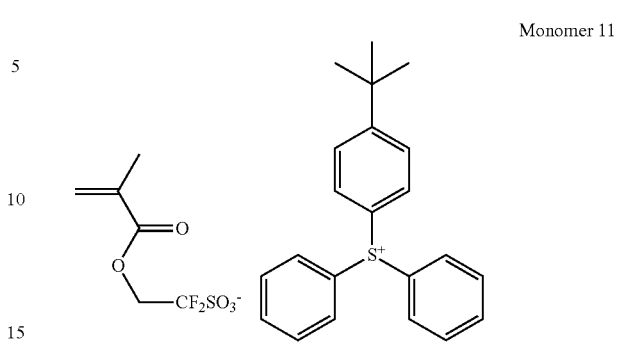

Monomer 12

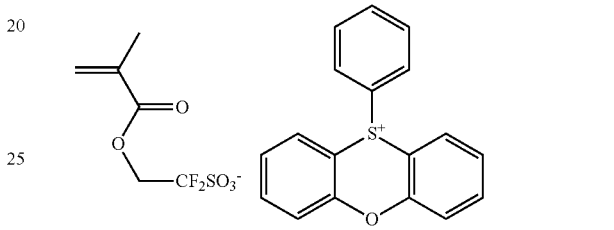

Polymer Synthesis Example

Polymers within the scope of the invention were synthesized according to the following formulation.

Polymer Synthesis Example 2-1

Synthesis of Polymer 1

In a dropping cylinder under a nitrogen blanket, 12.76 g of hydroquinone monomethacrylate, 3.64 g of acenaphthylene, 11.37 g of amyloxystyrene, 2.23 g of triphenylsulfonium 1,1,3,3,3-pentafluoro-2-methacryloyloxypropane-1-sulfonate (Monomer 1), 2.93 g of dimethyl 2,2'-azobis(2-methylpropionate) (V-601 by Wako Pure Chemical Industries, Ltd.), and 87 g of propylene glycol monomethyl ether (PGME) were fed to form a monomer solution. A flask under a nitrogen blanket was charged with 33 g of PGME and heated at 80° C. with stirring, after which the monomer solution was added dropwise over 4 hours. After the completion of dropwise addition, the polymerization solution was stirred for 4 hours while keeping the temperature of 80° C. It was then cooled to room temperature. The polymerization solution was added dropwise to 1,100 g of hexane/diisopropyl ether, after which the precipitated copolymer was filtered. The copolymer was washed two times with 200 g of hexane and then dried in vacuum at 50° C. for 20 hours. The copolymer, designated Polymer 1, was obtained as white powder solids in an amount of 22.4 g and a yield of 75%.

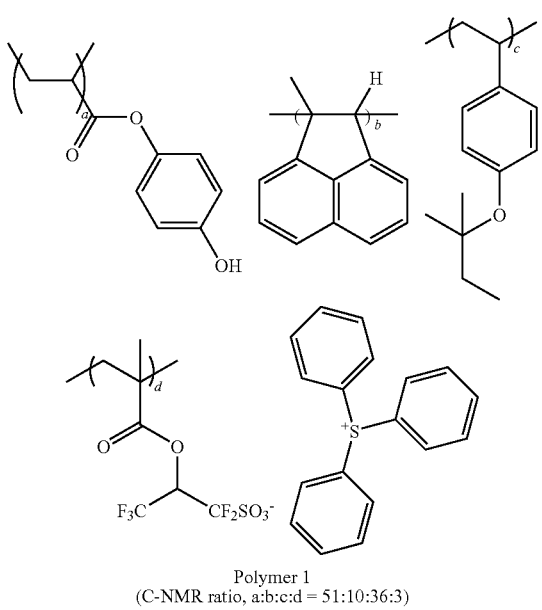

Polymer 1
(C-NMR ratio, a:b:c:d = 51:10:36:3)

Polymer Synthesis Examples 2-2 to 14, 22 and 25 to 38 and Comparative Synthesis Examples 1-1 to 13

Synthesis of Polymers 2 to 14, 22, 25 to 38, and Comparative Polymers 1 to 13

Polymers shown in Table 1 were prepared by the same procedure as Polymer Synthesis Example 2-1 except that the type and proportion of monomers were changed. The structure of the units in Table 1 is shown in Tables 2 to 8. Note that the ratio of incorporated units in Table 1 is expressed in a molar ratio.

Polymer Synthesis Examples 2-15 to 21

Synthesis of Polymers 15 to 21

A polymer was prepared by introducing "C-2" units therein according to the same procedure as in Polymer Synthesis Example 2-1 except that the type and proportion of monomers were changed. The polymer was dissolved in a solvent mixture of methanol and THF, to which oxalic acid was added whereupon deprotection reaction was allowed to run at 40° C. The reaction solution was neutralized with pyridine and purified by routine re-precipitation, obtaining a polymer having hydroxystyrene units (Polymers 15 to 19).

Polymers 20 and 21 were obtained by reacting the hydroxystyrene units in the polymer with 2-methyl-1-methoxypropan-1-ene or 8-(2'-methyl-1'-propenyloxy)tricyclo[5.2.1.0$^{2,6}$]decane under oxalic acid acidic conditions.

Polymer Synthesis Examples 2-23 and 24

Synthesis of Polymers 23 and 24

Polymers 23 and 24 were obtained by reacting Polymer 22 with 2-methyl-1-methoxypropan-1-ene or 8-(2'-methyl-1'-propenyloxy)tricyclo[5.2.1.0$^{2,6}$]decane under oxalic acid acidic conditions.

Polymer Synthesis Example 2-39

Synthesis of Polymer 39

In a dropping cylinder under a nitrogen blanket, 170.3 g of 4-(1-ethoxyethoxy)styrene, 15.42 g of acenaphthylene, 14.19 g of triphenylsulfonium 1,1,3,3,3-pentafluoro-2-methacryloyloxypropane-1-sulfonate (Monomer 1), 18.66 g of dimethyl 2,2'-azobis(2-methylpropionate) (V-601 by Wako Pure Chemical Industries, Ltd.), and 180 g of methyl ethyl ketone were fed to form a monomer solution. A 2000-mL flask under a nitrogen blanket was charged with 120 g of methyl ethyl ketone and heated at 80° C. with stirring, after which the monomer solution was added dropwise over 4 hours. After the completion of dropwise addition, the polymerization solution was continuously stirred for 20 hours while keeping the temperature of 80° C. It was then cooled to room temperature. To the polymerization solution were added 200 g of methanol and 4.00 g of oxalic acid dihydrate, followed by stirring at 50° C. for 5 hours. The solution was cooled to room temperature, to which 4 g of pyridine was added for neutralization. The reaction solution was concentrated, and the concentrate dissolved in 500 g of ethyl acetate and 200 g of water. After thorough agitation, the ethyl acetate phase was taken out by separatory operation and washed 6 times with water. The ethyl acetate was distilled off, and the residue dissolved in 350 g of acetone. The acetone solution was added dropwise to 8 L of water whereupon a copolymer precipitated out. The copolymer was collected by filtration, washed twice with 2 L of water, and dried at 50° C. for 24 hours, obtaining 140 g of base polymer BP-1 having Mw=4,848 and Mw/Mn=1.46.

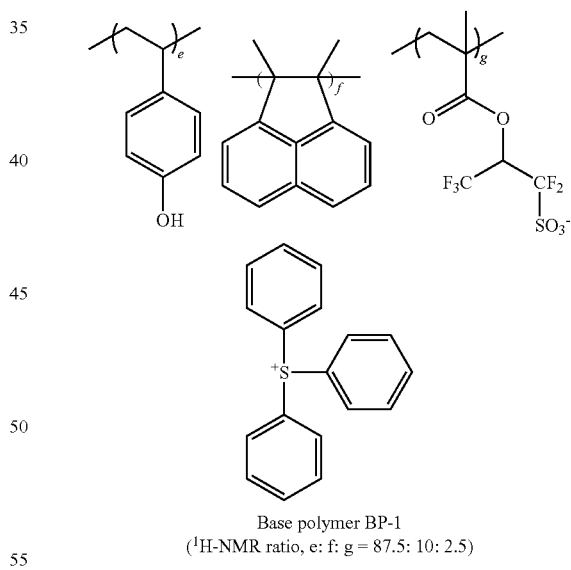

Base polymer BP-1
($^1$H-NMR ratio, e: f: g = 87.5: 10: 2.5)

A 100-mL reactor under a nitrogen blanket was charged with 10 g of base polymer BP-1 and 40 g of THF, which was concentrated. The concentrate was again dissolved in 30 g of THF, to which 0.6 g of methanesulfonic acid was added. In a nitrogen atmosphere at a controlled temperature of 0-5° C., 4.76 g of 8-(2'-methyl-1'-propenyloxy)tricyclo[5.2.1.0$^{2,6}$]-decane was added dropwise to the solution under acidic conditions. After the completion of dropwise addition, the solution was aged for 6 hours. At the end of reaction, 0.66 g of triethylamine was added for neutralization. The reaction solution was added dropwise to 240 g of hexane whereupon a polymer precipitated. The polymer was collected by filtration, washed twice with 50 g of hexane, and dissolved in 35 g of acetic acid and 20 g of water, followed by 6 times of water washing and phase separation. The organic layer resulting from the final phase separation, that is, ethyl acetate solution was concentrated by distilling off the ethyl acetate, and dissolved in 20 g of acetone. The acetone solution was added dropwise to 400 g of water whereupon an acetal form of polymer precipitated. The acetal form of polymer was collected by filtration, washed twice with 2 L of water, and dried at 40° C. for 24 hours, obtaining 9 g of an acetal-modified polymer designated Polymer 39. Polymer 39 had Mw=5,010 and Mw/Mn=1.40.

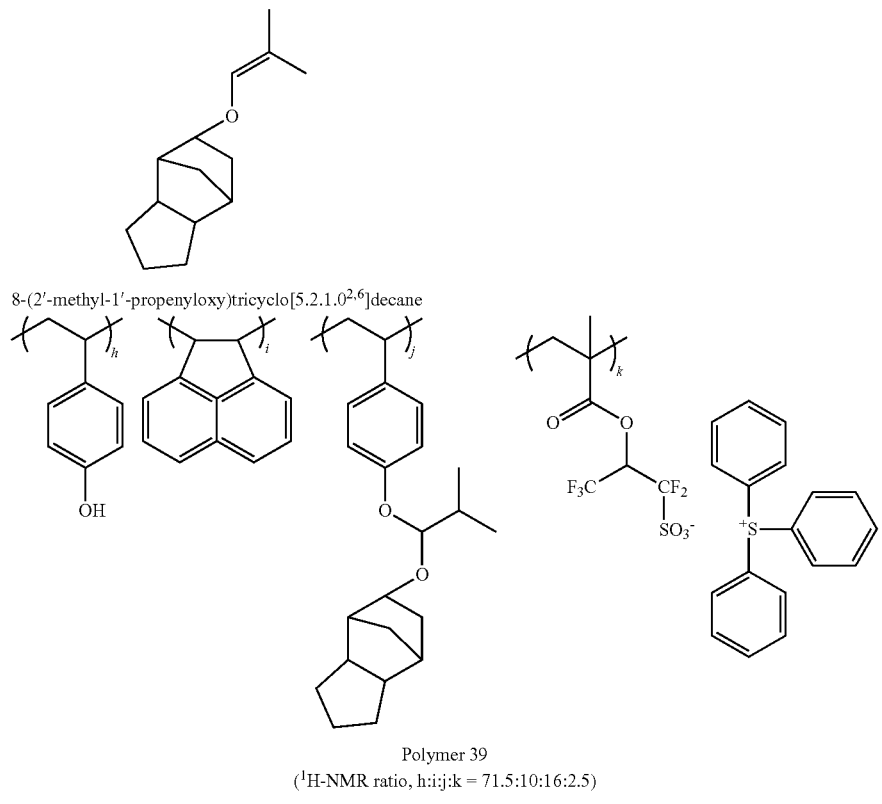

With respect to deprotection and protection of polyhydroxystyrene derivatives, reference should be made to Patent Documents 8 and 9.

TABLE 1

| Resin | Unit 1 (incorporation ratio) | Unit 2 (incorporation ratio) | Unit 3 (incorporation ratio) | Unit 4 (incorporation ratio) | Unit 5 (incorporation ratio) |
|---|---|---|---|---|---|
| Polymer 1 | PM-1 (0.03) | A-2 (0.51) | B-2 (0.36) | D-2 (0.10) | — |
| Comparative Polymer 1 | PM-1 (0.18) | A-2 (0.52) | B-2 (0.20) | D-2 (0.10) | — |
| Comparative Polymer 2 | PM-1 (0.10) | A-2 (0.50) | B-2 (0.30) | D-2 (0.10) | — |
| Comparative Polymer 3 | PM-1 (0.07) | A-2 (0.50) | B-2 (0.33) | D-2 (0.10) | — |
| Polymer 2 | PM-1 (0.03) | A-2 (0.51) | B-2 (0.37) | D-1 (0.10) | — |
| Polymer 3 | PM-1 (0.04) | A-2 (0.50) | B-3 (0.36) | D-2 (0.10) | — |
| Comparative Polymer 4 | PM-1 (0.08) | A-2 (0.50) | B-3 (0.32) | D-2 (0.10) | — |
| Polymer 4 | PM-1 (0.03) | A-2 (0.52) | E-1 (0.34) | D-2 (0.11) | — |
| Comparative Polymer 5 | PM-1 (0.07) | A-2 (0.51) | E-1 (0.31) | D-2 (0.11) | — |
| Polymer 5 | PM-1 (0.04) | A-2 (0.52) | E-2 (0.36) | D-2 (0.08) | — |
| Polymer 6 | PM-1 (0.03) | A-2 (0.55) | E-3 (0.32) | D-2 (0.10) | — |
| Comparative Polymer 6 | PM-1 (0.07) | A-2 (0.53) | E-3 (0.30) | D-2 (0.10) | — |
| Polymer 7 | PM-1 (0.03) | A-2 (0.53) | C-2 (0.34) | D-2 (0.10) | — |
| Comparative | PM-1 (0.08) | A-2 (0.52) | C-2 (0.30) | D-2 (0.10) | — |

TABLE 1-continued

| Resin | Unit 1 (incorporation ratio) | Unit 2 (incorporation ratio) | Unit 3 (incorporation ratio) | Unit 4 (incorporation ratio) | Unit 5 (incorporation ratio) |
|---|---|---|---|---|---|
| Polymer 7 | | | | | |
| Polymer 8 | PM-1 (0.03) | A-2 (0.51) | B-2 (0.27) | D-2 (0.10) | F-1 (0.09) |
| Polymer 8 | PM-1 (0.03) | A-2 (0.50) | B-2 (0.27) | D-2 (0.10) | F-2 (0.10) |
| Polymer 9 | PM-1 (0.03) | A-2 (0.51) | B-2 (0.27) | D-2 (0.10) | F-3 (0.09) |
| Polymer 10 | PM-1 (0.03) | A-2 (0.50) | B-2 (0.27) | D-2 (0.10) | F-4 (0.10) |
| Comparative Polymer 8 | PM-1 (0.08) | A-2 (0.50) | B-2 (0.22) | D-2 (0.10) | F-4 (0.10) |
| Polymer 11 | PM-1 (0.03) | A-2 (0.50) | B-2 (0.27) | D-2 (0.10) | F-5 (0.10) |
| Polymer 12 | PM-1 (0.04) | A-2 (0.52) | B-2 (0.25) | D-2 (0.10) | B-1 (0.09) |
| Polymer 13 | PM-1 (0.04) | A-2 (0.40) | B-2 (0.36) | D-2 (0.11) | A-3 (0.09) |
| Polymer 14 | PM-1 (0.03) | A-2 (0.40) | B-2 (0.21) | D-2 (0.11) | C-2 (0.15) |
| Polymer 15 | PM-1 (0.04) | A-2 (0.40) | B-2 (0.30) | D-2 (0.11) | A-1 (0.15) |
| Polymer 16 | PM-1 (0.03) | A-1 (0.52) | B-2 (0.35) | D-2 (0.10) | — |
| Polymer 17 | PM-3 (0.03) | A-1 (0.50) | B-2 (0.37) | D-2 (0.10) | — |
| Polymer 18 | PM-4 (0.03) | A-1 (0.51) | B-2 (0.35) | D-2 (0.11) | — |
| Polymer 19 | PM-6 (0.03) | A-1 (0.51) | B-2 (0.36) | D-2 (0.10) | — |
| Polymer 20 | PM-1 (0.02) | A-1 (0.61) | B-2 (0.23) | D-2 (0.10) | C-1 (0.04) |
| Polymer 21 | PM-1 (0.02) | A-1 (0.62) | B-2 (0.23) | D-2 (0.08) | C-3 (0.05) |
| Polymer 22 | PM-1 (0.02) | A-2 (0.58) | B-2 (0.30) | D-2 (0.10) | — |
| Polymer 23 | PM-1 (0.02) | A-2 (0.53) | B-2 (0.30) | D-2 (0.10) | C-4 (0.05) |
| Polymer 24 | PM-1 (0.02) | A-2 (0.54) | B-2 (0.30) | D-2 (0.10) | C-5 (0.04) |
| Polymer 25 | PM-2 (0.03) | A-2 (0.50) | B-2 (0.37) | D-2 (0.10) | — |
| Comparative Polymer 9 | PM-2 (0.07) | A-2 (0.50) | B-2 (0.33) | D-2 (0.10) | — |
| Polymer 26 | PM-3 (0.03) | A-2 (0.50) | B-2 (0.37) | D-2 (0.10) | — |
| Comparative Polymer 10 | PM-3 (0.08) | A-2 (0.50) | B-2 (0.32) | D-2 (0.10) | — |
| Polymer 27 | PM-3 (0.04) | A-2 (0.52) | E-1 (0.34) | D-2 (0.10) | — |
| Polymer 28 | PM-3 (0.04) | A-2 (0.51) | B-3 (0.35) | D-2 (0.10) | — |
| Polymer 29 | PM-4 (0.03) | A-2 (0.52) | B-2 (0.35) | D-2 (0.10) | — |
| Comparative Polymer 11 | PM-4 (0.08) | A-2 (0.51) | B-2 (0.31) | D-2 (0.10) | — |
| Polymer 30 | PM-4 (0.04) | A-2 (0.51) | B-3 (0.35) | D-2 (0.10) | — |
| Polymer 31 | PM-4 (0.04) | A-2 (0.50) | E-3 (0.36) | D-2 (0.10) | — |
| Polymer 32 | PM-5 (0.03) | A-2 (0.52) | B-2 (0.34) | D-2 (0.11) | — |
| Comparative Polymer 12 | PM-5 (0.09) | A-2 (0.52) | B-2 (0.28) | D-2 (0.11) | — |
| Polymer 33 | PM-6 (0.03) | A-2 (0.53) | B-2 (0.34) | D-2 (0.10) | — |
| Comparative Polymer 13 | PM-6 (0.08) | A-2 (0.52) | B-2 (0.30) | D-2 (0.10) | — |
| Polymer 34 | PM-6 (0.04) | A-2 (0.51) | B-3 (0.35) | D-2 (0.10) | — |
| Polymer 35 | PM-6 (0.04) | A-2 (0.52) | E-3 (0.34) | D-2 (0.10) | — |
| Polymer 36 | PM-1 (0.03) | A-4 (0.51) | B-2 (0.36) | D-2 (0.10) | — |
| Polymer 37 | PM-3 (0.03) | A-4 (0.51) | B-2 (0.35) | D-2 (0.11) | — |
| Polymer 38 | PM-1 (0.03) | A-2 (0.60) | B-2 (0.37) | — | — |
| Polymer 39 | PM-1 (0.025) | A-1 (0.715) | — | D-2 (0.10) | C-3 (0.16) |

TABLE 2

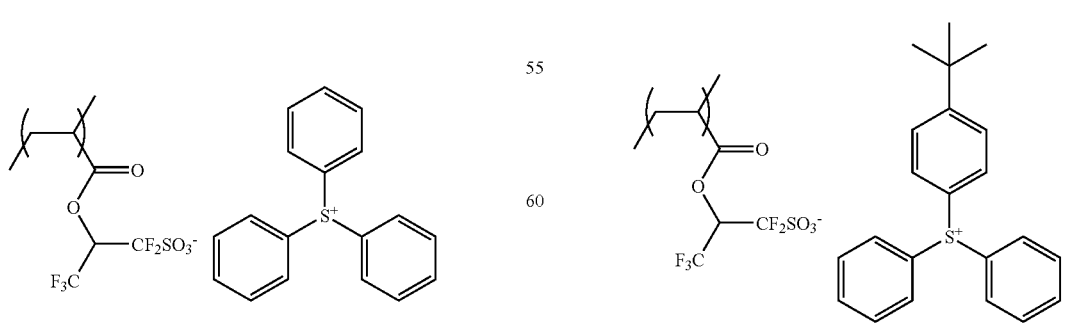

TABLE 2-continued
PM-3
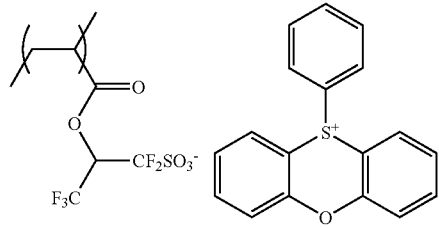
PM-4
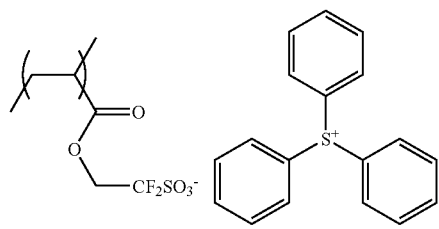
PM-5
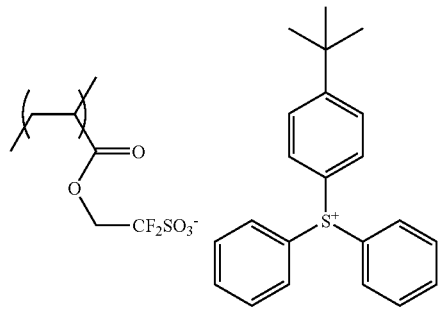
PM-6
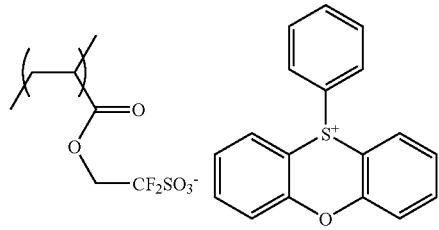
TABLE 3
A-1
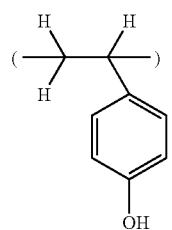
TABLE 3-continued
A-2
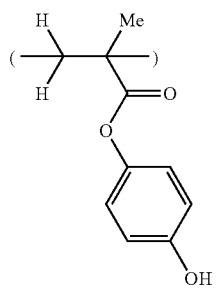
A-3
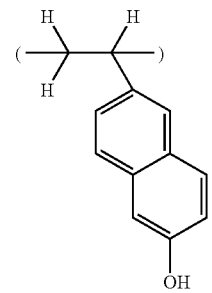
A-4
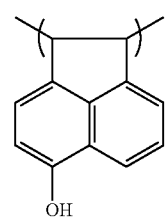
TABLE 4
B-1
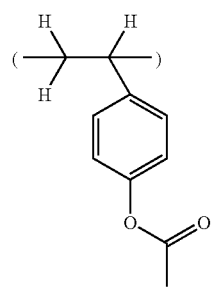

TABLE 4-continued
B-2
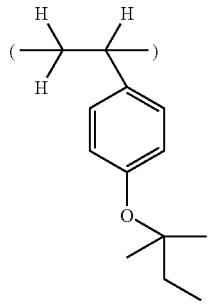
B-3
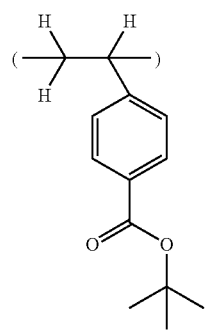
TABLE 5
C-1
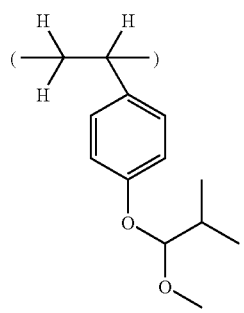
C-2
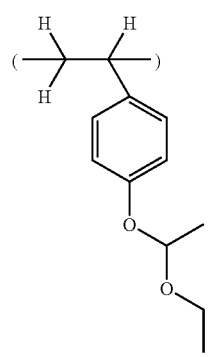
TABLE 5-continued
C-3
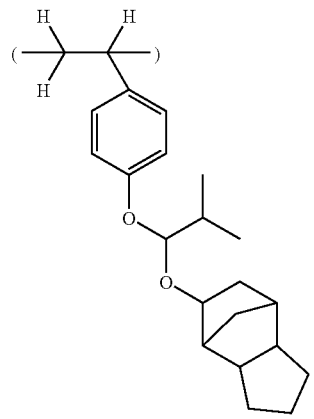
C-4
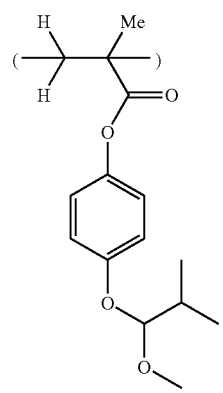
C-5
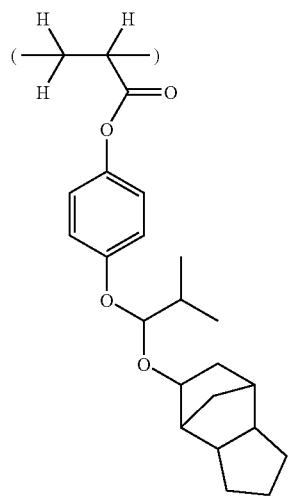

TABLE 6
D-1
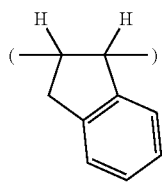
D-2
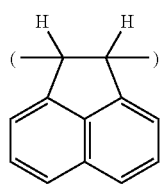
TABLE 7
E-1
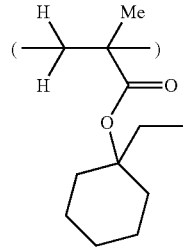
E-2
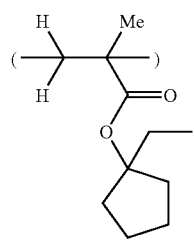
E-3
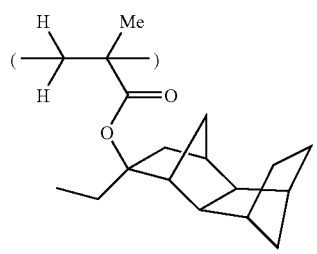
TABLE 8
F-1
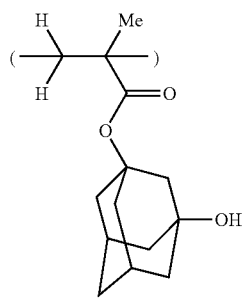
F-2
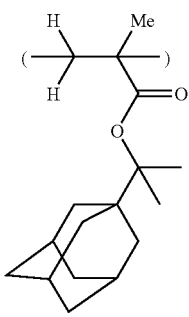
F-3
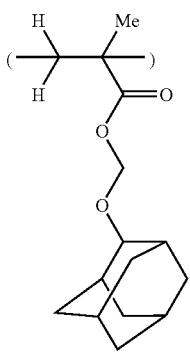
F-4
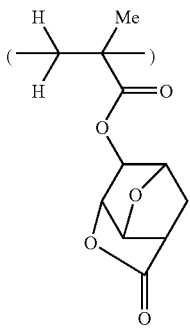

TABLE 8-continued

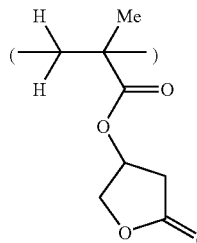

F-5

Examples and Comparative Examples

Preparation of Positive Resist Compositions

Positive resist compositions in solution form were prepared by dissolving the polymers synthesized above (Polymers 1 to 21, 23 to 39 or Comparative Polymers 1 to 13), an optional acid generator (PAG-A), and a basic compound (Base-1) in a solvent mixture (Solvents 1, 2 and 3) in accordance with the recipe shown in Table 9. These compositions were each filtered through a filter having a pore size of 0.2 μm or a nylon or UPE filter having a pore size of 0.02 μm. Note that 0.075 part by weight of surfactant PF-636 (Omnova Solutions) was added to each composition.

In Table 9, Solvents 1, 2 and 3 are propylene glycol monomethyl ether acetate (PGMEA), ethyl lactate (EL), and propylene glycol monomethyl ether (PGME), respectively.

TABLE 9

|  | Resin (pbw) | Acid generator (pbw) | Base (pbw) | Solvent 1 (pbw) | Solvent 2 (pbw) | Solvent 3 (pbw) |
|---|---|---|---|---|---|---|
| Example 1 | Polymer 1(80) | — | Base-1(0.8) | PGMEA(1,000) | EL(1,000) | PGME(1,300) |
| Comparative Example 1 | Comparative Polymer 1(80) | — | Base-1(0.7) | PGMEA(1,000) | EL(1,000) | PGME(1,300) |
| Comparative Example 2 | Comparative Polymer 2(80) | — | Base-1(0.7) | PGMEA(1,000) | EL(1,000) | PGME(1,300) |
| Comparative Example 3 | Comparative Polymer 3(80) | — | Base-1(0.7) | PGMEA(1,000) | EL(1,000) | PGME(1,300) |
| Example 2 | Polymer 1(80) | PA6-A(2) | Base-1(0.65) | PGMEA(1,000) | EL(1,000) | PGME(1,300) |
| Example 3 | Polymer 2(80) | — | Base-1(0.7) | PGMEA(1,000) | EL(1,000) | PGME(1,300) |
| Example 4 | Polymer 3(80) | — | Base-1(0.7) | PGMEA(1,000) | EL(1,000) | PGME(1,300) |
| Comparative Example 4 | Comparative Polymer 4(80) | — | Base-1(0.7) | PGMEA(1,000) | EL(1,000) | PGME(1,300) |
| Example 5 | Polymer 4(80) | — | Base-1(0.7) | PGMEA(1,000) | EL(1,000) | PGME(1,300) |
| Comparative Example 5 | Comparative Polymer 5(80) | — | Base-1(0.7) | PGMEA(1,000) | EL(1,000) | PGME(1,300) |
| Example 6 | Polymer 5(80) | — | Base-1(0.7) | PGMEA(1,000) | EL(1,000) | PGME(1,300) |
| Example 7 | Polymer 6(80) | — | Base-1(0.7) | PGMEA(1,000) | EL(1,000) | PGME(1,300) |
| Comparative Example 6 | Comparative Polymer 6(80) | — | Base-1(0.7) | PGMEA(1,000) | EL(1,000) | PGME(1,300) |
| Example 8 | Polymer 7(80) | — | Base-1(0.7) | PGMEA(1,000) | EL(1,000) | PGME(1,300) |
| Comparative Example 7 | Comparative Polymer 7(80) | — | Base-1(0.7) | PGMEA(1,000) | EL(1,000) | PGME(1,300) |
| Example 9 | Polymer 8(80) | — | Base-1(0.7) | PGMEA(1,000) | EL(1,000) | PGME(1,300) |
| Example 10 | Polymer 9(80) | — | Base-1(0.7) | PGMEA(1,000) | EL(1,000) | PGME(1,300) |
| Example 11 | Polymer 10(80) | — | Base-1(0.7) | PGMEA(1,000) | EL(1,000) | PGME(1,300) |
| Comparative Example 8 | Comparative Polymer 8(80) | — | Base-1(0.7) | PGMEA(1,000) | EL(1,000) | PGME(1,300) |
| Example 12 | Polymer 11(80) | — | Base-1(0.7) | PGMEA(1,000) | EL(1,000) | PGME(1,300) |
| Example 13 | Polymer 12(80) | — | Base-1(0.7) | PGMEA(1,000) | EL(1,000) | PGME(1,300) |
| Example 14 | Polymer 13(80) | — | Base-1(0.7) | PGMEA(1,000) | EL(1,000) | PGME(1,300) |
| Example 15 | Polymer 14(80) | — | Base-1(0.7) | PGMEA(1,000) | EL(1,000) | PGME(1,300) |
| Example 16 | Polymer 15(80) | — | Base-1(0.7) | PGMEA(1,000) | EL(1,000) | PGME(1,300) |
| Example 17 | Polymer 16(80) | — | Base-1(0.7) | PGMEA(1,000) | EL(1,000) | PGME(1,300) |
| Example 18 | Polymer 17(80) | — | Base-1(0.7) | PGMEA(1,000) | EL(1,000) | PGME(1,300) |
| Example 19 | Polymer 18(80) | — | Base-1(0.7) | PGMEA(1,000) | EL(1,000) | PGME(1,300) |
| Example 20 | Polymer 19(80) | — | Base-1(0.7) | PGMEA(1,000) | EL(1,000) | PGME(1,300) |
| Example 21 | Polymer 20(80) | — | Base-1(0.7) | PGMEA(1,000) | EL(1,000) | PGME(1,300) |
| Example 22 | Polymer 21(80) | — | Base-1(0.7) | PGMEA(1,000) | EL(1,000) | PGME(1,300) |
| Example 23 | Polymer 23(80) | — | Base-1(0.7) | PGMEA(1,000) | EL(1,000) | PGME(1,300) |
| Example 24 | Polymer 24(80) | — | Base-1(0.7) | PGMEA(1,000) | EL(1,000) | PGME(1,300) |
| Example 25 | Polymer 25(80) | — | Base-1(0.7) | PGMEA(1,000) | EL(1,000) | PGME(1,300) |

TABLE 9-continued

| | Resin (pbw) | Acid generator (pbw) | Base (pbw) | Solvent 1 (pbw) | Solvent 2 (pbw) | Solvent 3 (pbw) |
|---|---|---|---|---|---|---|
| Comparative Example 9 | Comparative Polymer 9(80) | — | Base-1(0.7) | PGMEA(1,000) | EL(1,000) | PGME(1,300) |
| Example 26 | Polymer 26(80) | — | Base-1(0.7) | PGMEA(1,000) | EL(1,000) | PGME(1,300) |
| Comparative Example 10 | Comparative Polymer 10(80) | — | Base-1(0.7) | PGMEA(1,000) | EL(1,000) | PGME(1,300) |
| Example 27 | Polymer 27(80) | — | Base-1(0.7) | PGMEA(1,000) | EL(1,000) | PGME(1,300) |
| Example 28 | Polymer 28(80) | — | Base-1(0.7) | PGMEA(1,000) | EL(1,000) | PGME(1,300) |
| Example 29 | Polymer 29(80) | — | Base-1(0.7) | PGMEA(1,000) | EL(1,000) | PGME(1,300) |
| Comparative Example 11 | Comparative Polymer 11(80) | — | Base-1(0.7) | PGMEA(1,000) | EL(1,000) | PGME(1,300) |
| Example 30 | Polymer 30(80) | — | Base-1(0.7) | PGMEA(1,000) | EL(1,000) | PGME(1,300) |
| Example 31 | Polymer 31(80) | — | Base-1(0.7) | PGMEA(1,000) | EL(1,000) | PGME(1,300) |
| Example 32 | Polymer 32(80) | — | Base-1(0.7) | PGMEA(1,000) | EL(1,000) | PGME(1,300) |
| Comparative Example 12 | Comparative Polymer 12(80) | — | Base-1(0.7) | PGMEA(1,000) | EL(1,000) | PGME(1,300) |
| Example 33 | Polymer 33(80) | — | Base-1(0.7) | PGMEA(1,000) | EL(1,000) | PGME(1,300) |
| Comparative Example 13 | Comparative Polymer 13(80) | — | Base-1(0.7) | PGMEA(1,000) | EL(1,000) | PGME(1,300) |
| Example 34 | Polymer 34(80) | — | Base-1(0.7) | PGMEA(1,000) | EL(1,000) | PGME(1,300) |
| Example 35 | Polymer 35(80) | — | Base-1(0.7) | PGMEA(1,000) | EL(1,000) | PGME(1,300) |
| Example 36 | Polymer 36(80) | — | Base-1(0.7) | PGMEA(1,000) | EL(1,000) | PGME(1,300) |
| Example 37 | Polymer 37(80) | — | Base-1(0.7) | PGMEA(1,000) | EL(1,000) | PGME(1,300) |
| Example 38 | Polymer 38(80) | — | Base-1(0.7) | PGMEA(1,000) | EL(1,000) | PGME(1,300) |
| Example 39 | Polymer 39(80) | — | Base-1(0.7) | PGMEA(1,000) | EL(1,000) | PGME(1,300) |

EB Image Writing Test

Using a coater/developer system Clean Track ACT M (Tokyo Electron Ltd.), each of the positive resist compositions (Examples 1 to 39, Comparative Examples 1 to 13) was spin coated on a mask blank of 152 mm square having a chromium oxynitride film as the outermost surface and pre-baked on a hot plate at 100° C. for 600 seconds to form a resist film of 60 nm thick. The thickness of a resist film was measured by an optical thin film measurement system NanoSpec (Nanometrics Inc.). Measurement was made at 81 points within the surface region of the blank substrate excluding an outer region extending 10 mm inward from the periphery of the blank, from which an average film thickness and a film thickness range were determined.

The wafer was exposed by means of an EB lithography system EBM-5000plus (NuFlare Technology Inc.) at an accelerating voltage of 50 keV, post-exposure baked (PEB) at 100° C. for 600 seconds, and developed in a 2.38 wt % tetramethylammonium hydroxide aqueous solution to form a positive resist pattern.

The resist pattern was evaluated as follows. The pattern-bearing wafer was observed under a top-down scanning electron microscope (TD-SEM). The optimum exposure was defined as the exposure dose ($\mu C/cm^2$) which provided a 1:1 resolution at the top and bottom of a 200-nm 1:1 line-and-space pattern. The maximum resolution of the resist was defined as the minimum line width of a L/S pattern that was resolved and separated at the optimum exposure. The line edge roughness (LER) of a 100-nm L/S pattern was evaluated under SEM. The pattern was visually observed to judge whether or not the profile was rectangular. Adhesion was examined during visual observation under TD-SEM by judging whether or not the film was stripped.

The test results of inventive and comparative resist compositions by EB lithography are shown in Table 10.

TABLE 10

| | Optimum exposure ($\mu C/cm^2$) | Maximum resolution (nm) | LER (nm) | Pattern profile | Adhesion |
|---|---|---|---|---|---|
| Example 1 | 25 | 35 | 6.0 | rectangular | good |
| Comparative Example 1 | not uniformly coated on substrate; streation occurred | | | | |
| Comparative Example 2 | 24 | 100 | 8.0 | inversely tapered | pattern stripped |
| Comparative Example 3 | 25 | 80 | 8.1 | inversely tapered | pattern stripped |
| Example 2 | 24 | 40 | 6.2 | rectangular | good |
| Example 3 | 26 | 35 | 6.3 | rectangular | good |
| Example 4 | 27 | 40 | 6.1 | rectangular | good |
| Comparative Example 4 | 25 | 80 | 8.2 | inversely tapered | pattern stripped |
| Example 5 | 25 | 35 | 6.1 | somewhat rounded top | good |
| Comparative Example 5 | 24 | 90 | 8.0 | inversely tapered | pattern stripped |
| Example 6 | 26 | 40 | 5.8 | rectangular | good |
| Example 7 | 26 | 40 | 6.0 | rectangular | good |
| Comparative Example 6 | 25 | 80 | 7.9 | inversely tapered | pattern stripped |
| Example 8 | 26 | 40 | 5.5 | rectangular | good |

TABLE 10-continued

| | Optimum exposure ($\mu C/cm^2$) | Maximum resolution (nm) | LER (nm) | Pattern profile | Adhesion |
|---|---|---|---|---|---|
| Comparative Example 7 | 27 | 90 | 8.0 | inversely tapered | pattern stripped |
| Example 9 | 28 | 35 | 6.1 | rectangular | good |
| Example 10 | 26 | 35 | 5.9 | rectangular | good |
| Example 11 | 27 | 35 | 5.9 | rectangular | good |
| Comparative Example 8 | 26 | 80 | 8.1 | inversely tapered | pattern stripped |
| Example 12 | 28 | 40 | 6.2 | rectangular | good |
| Example 13 | 27 | 35 | 5.8 | rectangular | good |
| Example 14 | 29 | 35 | 6.0 | somewhat rounded top | good |
| Example 15 | 27 | 35 | 6.4 | rectangular | good |
| Example 16 | 29 | 40 | 6.1 | rectangular | good |
| Example 17 | 26 | 35 | 6.2 | rectangular | good |
| Example 18 | 27 | 40 | 6.0 | rectangular | good |
| Example 19 | 28 | 35 | 6.1 | rectangular | good |
| Example 20 | 27 | 40 | 6.0 | rectangular | good |
| Example 21 | 28 | 35 | 6.3 | somewhat rounded top | good |
| Example 22 | 28 | 40 | 6.2 | rectangular | good |
| Example 23 | 26 | 40 | 6.1 | somewhat rounded top | good |
| Example 24 | 27 | 35 | 6.3 | rectangular | good |
| Example 25 | 27 | 40 | 6.0 | rectangular | good |
| Comparative Example 9 | 28 | 80 | 8.3 | inversely tapered | pattern stripped |
| Example 26 | 28 | 40 | 6.2 | rectangular | good |
| Comparative Example 10 | 28 | 70 | 8.1 | inversely tapered | pattern stripped |
| Example 27 | 28 | 35 | 6.2 | rectangular | good |
| Example 28 | 26 | 35 | 6.1 | rectangular | good |
| Example 29 | 28 | 40 | 6.2 | rectangular | good |
| Example 30 | 28 | 40 | 6.0 | rectangular | good |
| Comparative Example 11 | 27 | 80 | 8.1 | inversely tapered | pattern stripped |
| Example 31 | 27 | 35 | 6.1 | rectangular | good |
| Example 32 | 28 | 40 | 6.2 | rectangular | good |
| Comparative Example 12 | 26 | 70 | 8.0 | inversely tapered | pattern stripped |
| Example 33 | 28 | 40 | 6.2 | rectangular | good |
| Comparative Example 13 | 27 | 80 | 8.2 | inversely tapered | pattern stripped |
| Example 34 | 26 | 35 | 6.0 | rectangular | good |
| Example 35 | 28 | 40 | 6.2 | rectangular | good |
| Example 36 | 27 | 40 | 6.3 | rectangular | good |
| Example 37 | 26 | 60 | 6.6 | rectangular | good |
| Example 38 | 26 | 60 | 6.6 | rounded top + footing | good |
| Example 39 | 24 | 35 | 5.5 | rectangular | good |

As seen from Table 10, the resist compositions using a polymer within the scope of the invention exhibit excellent resolution and reduced values of LER, as compared with comparative resist compositions using a polymer containing at least 5 mol % of units having formula (1) based on the entire units. A resist composition using a polymer containing less than 5 mol % of units of sulfonic acid structure as defined herein is improved in coating and adhesion to a substrate having a surface layer of chromium base compound, while it is dramatically improved in resolution and forms a pattern of rectangular profile. The polymer has the advantages that no precipitates form during reaction and difficult solubility in resist solvents is obviated. In Example 38, resolution is rather poor, but a high contrast is achievable by copolymerizing indene or acenaphthylene units. It has been demonstrated that the chemically amplified resist composition is advantageously used as a fine size pattern or mask pattern-forming material by the EB lithography for the fabrication of VLSI devices.

Japanese Patent Application No. 2009-130020 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a polymer comprising units having a sufficient polarity in their molecule to impart adhesion to the polymer and units protected with an acid labile group and adapted to turn alkali soluble under the action of acid, said polymer further comprising recurring units having the general formula (1):

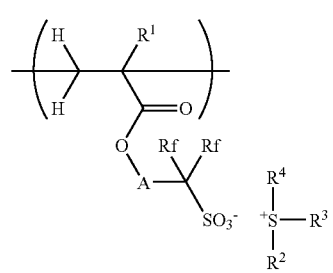

wherein $R^1$ is each independently hydrogen, fluorine, methyl or trifluoromethyl, Rf is each independently hydrogen, fluorine, trifluoromethyl or pentafluoroethyl, not all Rf are hydrogen, A is a divalent $C_1$-$C_{10}$ hydrocarbon group in which some or all hydrogen atoms may be substituted by fluorine atoms, or some methylene may be substituted by oxygen, $R^2$, $R^3$ and $R^4$ are each independently a substituted or unsubstituted straight or branched $C_1$-$C_{10}$ alkyl, alkenyl or oxoalkyl group or a substituted or unsubstituted $C_6$-$C_{18}$ aryl, aralkyl or aryloxoalkyl group, or at least two of $R^2$, $R^3$ and $R^4$ may bond together to form a ring with the sulfur atom, wherein recurring units containing an aromatic ring structure are present in an amount of at least 60 mol % and the recurring units having formula (1) are present in an amount of less than 5 mol %, based on the entire recurring units of the polymer.

2. The resist composition of claim 1 wherein the structure of the following formula:

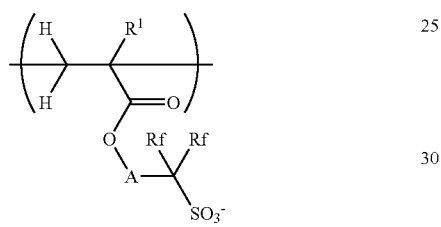

in the general formula (1) is one selected from the group consisting of the following structures:

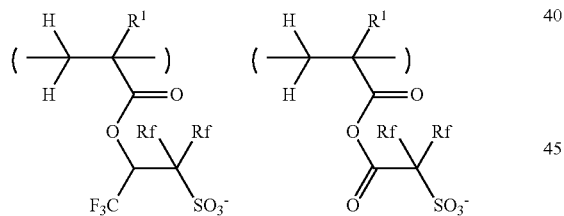

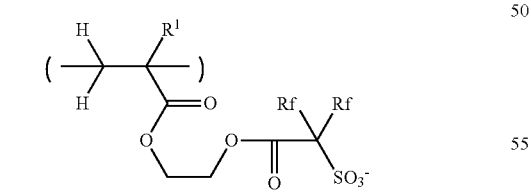

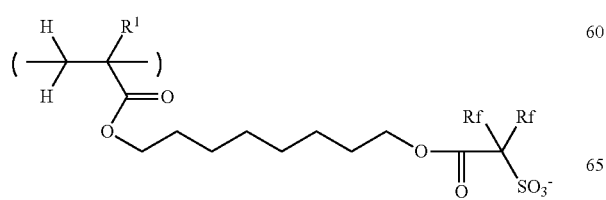

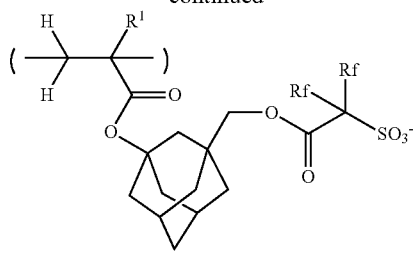

-continued

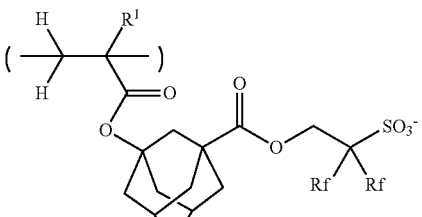

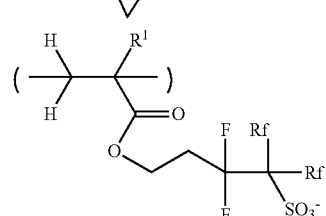

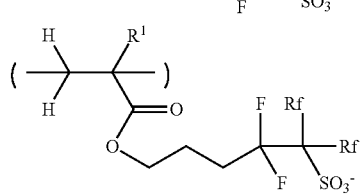

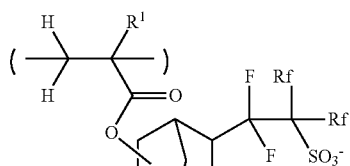

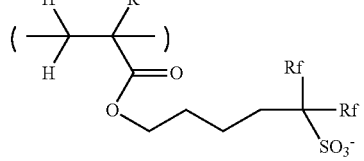

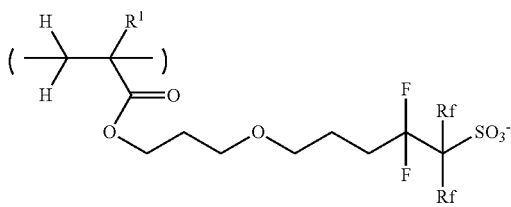

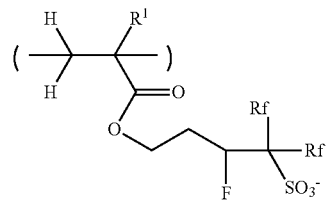

wherein $R^1$ and Rf are as defined above.

3. The resist composition of claim 1 wherein the recurring units having the general formula are represented by the following general formula (1a):

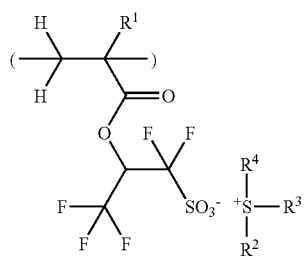
(1a)

wherein $R^1$ to $R^4$ are as defined above.

4. The resist composition of claim 1 wherein the units having a sufficient polarity in their molecule to impart adhesion to the polymer have the general formula (2):

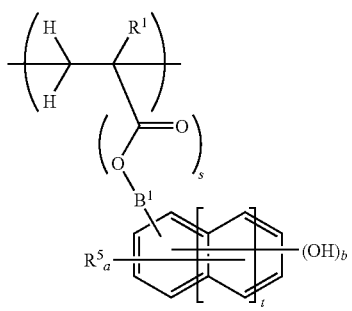
(2)

wherein s is each independently 0 or 1, t is each independently an integer of 0 to 2, $R^5$ is each independently hydrogen or a $C_1$-$C_6$ alkyl group, $B^1$ is a single bond or a $C_1$-$C_{10}$ alkylene group which may be separated by an ether bond, a is an integer of 0 to 3, and b is an integer of 1 to 3.

5. The resist composition of claim 4 wherein the units of the general formula (2) are selected from the group consisting of units having the following formulae:

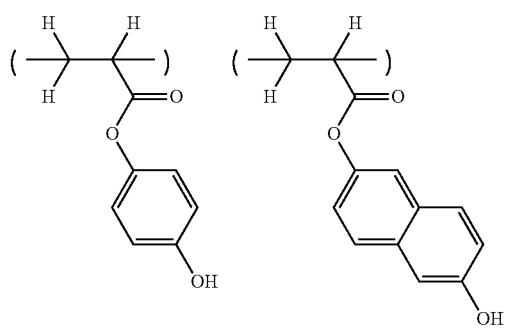

-continued

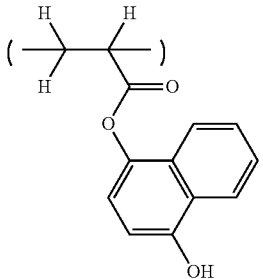

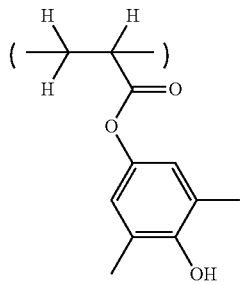 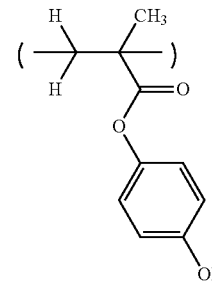

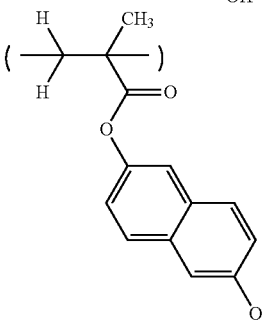 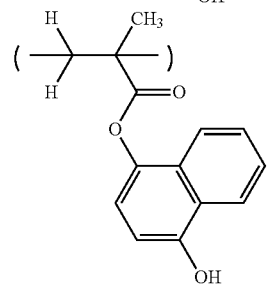

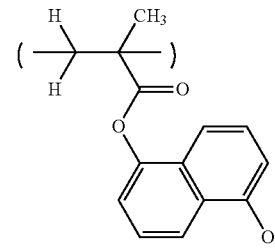 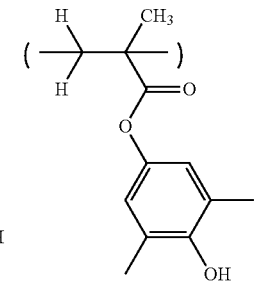

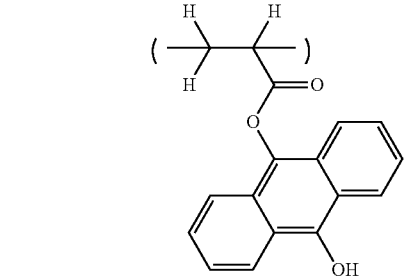

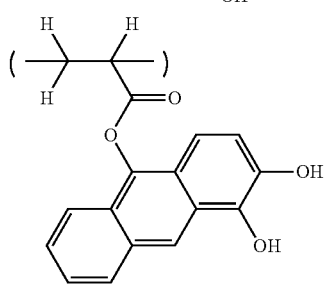

-continued

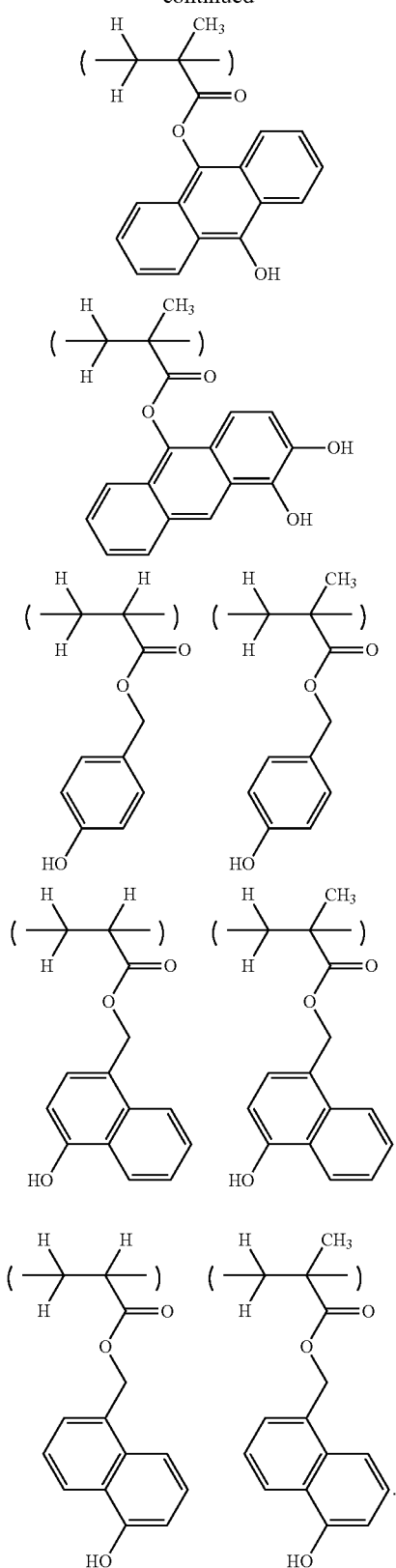

6. The resist composition of claim 1 wherein the units protected with an acid labile group and adapted to turn alkali soluble under the action of acid have the general formula (3):

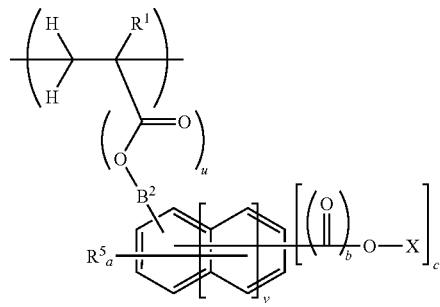

wherein u is 0 or 1, v is an integer of 0 to 2, $R^5$ is each independently hydrogen or a $C_1$-$C_6$ alkyl group, $B^2$ is a single bond or a $C_1$-$C_{10}$ alkylene group which may be separated by an ether bond, a is an integer of 0 to 3, b is 0 or 1, c is an integer of 1 to 3, in the case of c=1, X is an acid labile group, and in the case of c=2 or 3, X is hydrogen or an acid labile group, at least one X being an acid labile group.

7. The resist composition of claim 6 wherein the acid labile group in the general formula (3) is a tertiary alkyl group having 4 to 18 or an acetal group having the following general formula (9):

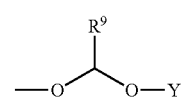

wherein $R^9$ is hydrogen or a straight, branched or cyclic $C_1$-$C_{10}$ alkyl group, and Y is a straight, branched, cyclic or polycyclic $C_1$-$C_{30}$ alkyl group.

8. The resist composition of claim 1 wherein said polymer further comprises units having the general formula (4) and/or (5):

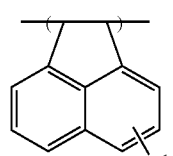

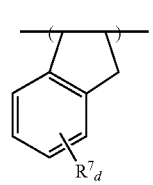

wherein d is an integer of 0 to 4, $R^6$ is each independently hydrogen, an optionally halogenated $C_1$-$C_6$ alkyl or primary or secondary alkoxy group, or an optionally halogenated $C_1$-$C_7$ alkylcarbonyloxy group, $R^7$ is each independently hydrogen, hydroxyl, $C_1$-$C_7$ alkylcarbonyloxy group, $C_1$-$C_6$ alkyl or alkoxy group, or halogenated alkyl or alkoxy group.

9. A process for forming a resist pattern, comprising the steps of applying the chemically amplified resist composition of claim 1 onto a processable substrate to form a resist film, exposing the resist film to a pattern of high-energy radiation, and developing the exposed resist film with an alkaline developer to form a resist pattern.

10. The process of claim 9 wherein the high-energy radiation is EUV or electron beam.

11. The process of claim 9 wherein the processable substrate comprises an outermost surface layer of chromium-containing material.

12. The process of claim 9 wherein the processable substrate is a photomask blank.

13. The resist composition of claim 1 wherein the recurring unit of formula (1) is at least one selected from the group consisting of the following structures:

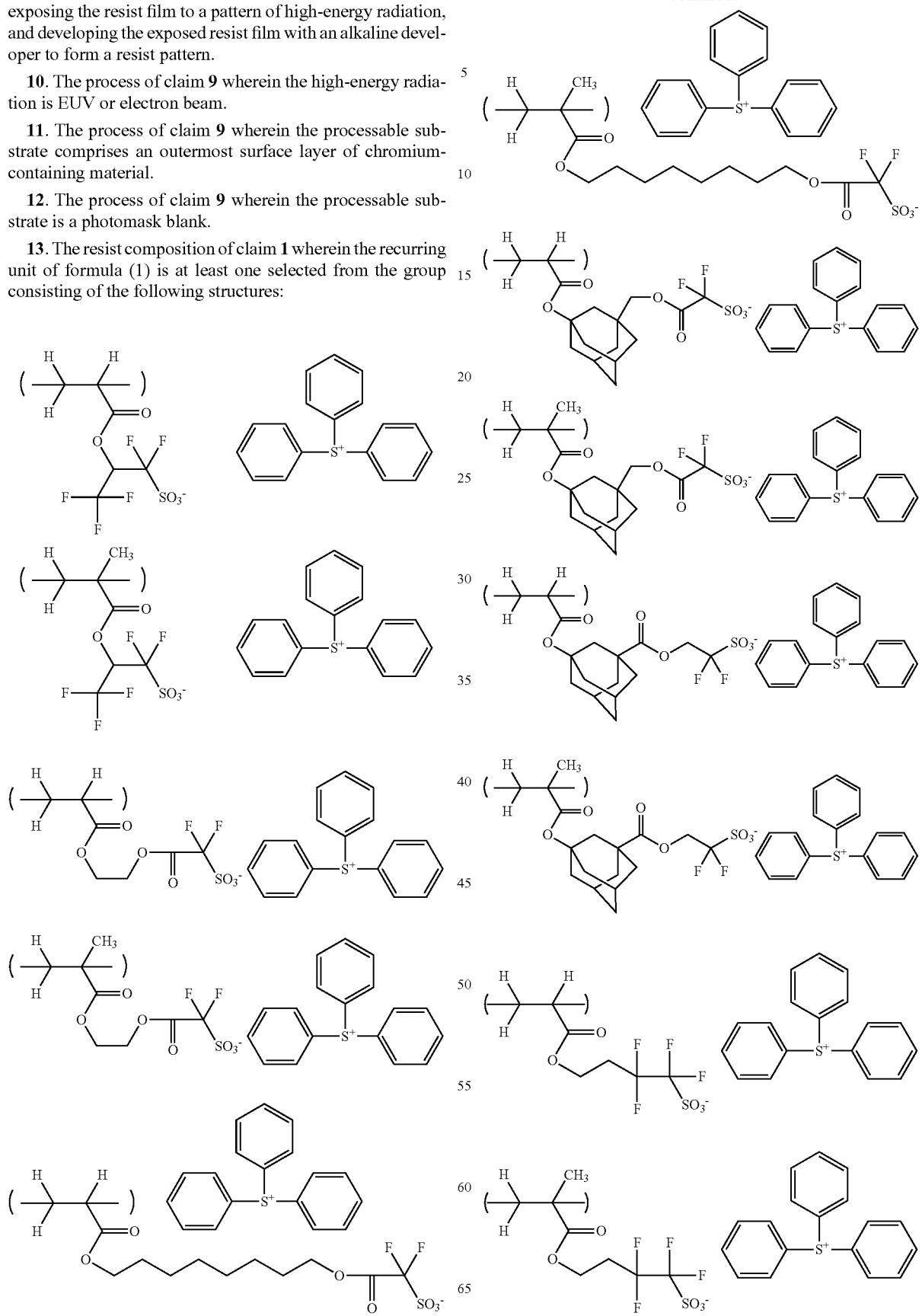

75
-continued
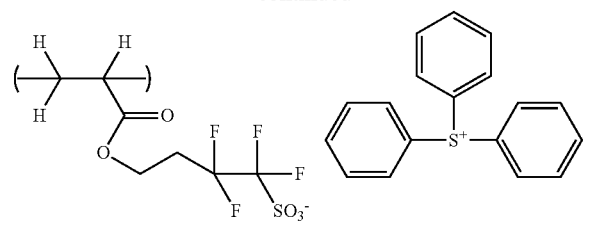
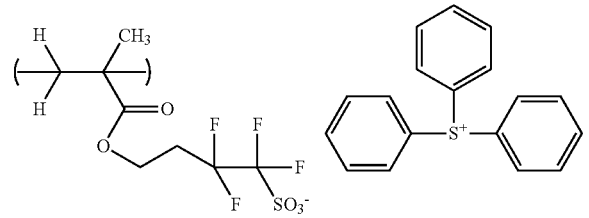
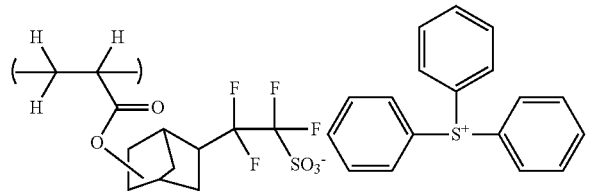
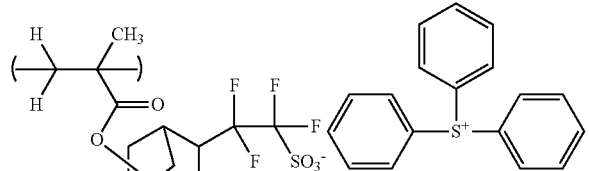
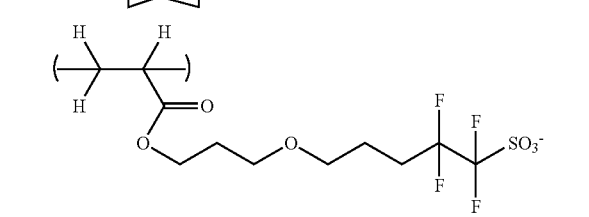
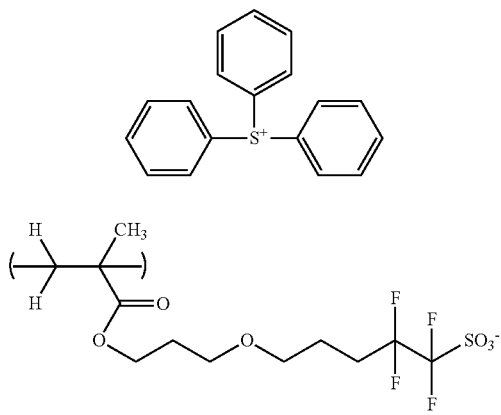
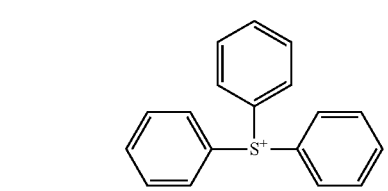
76
-continued
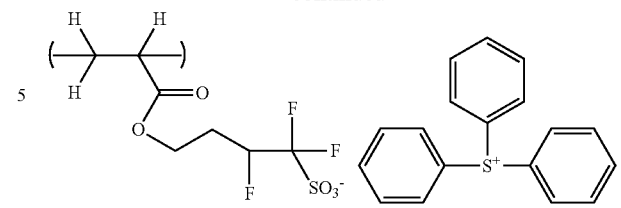
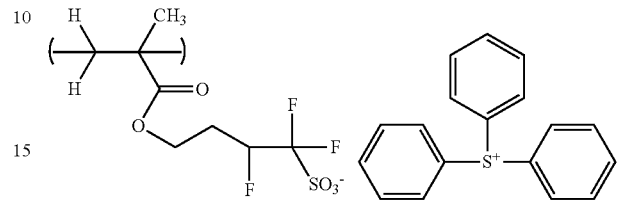
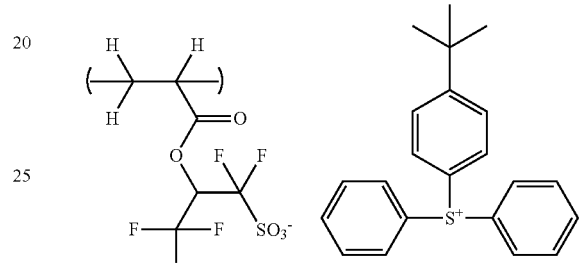
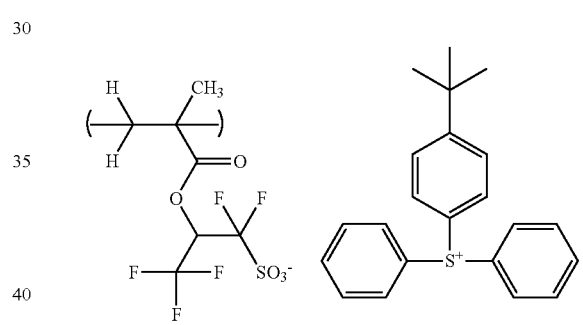
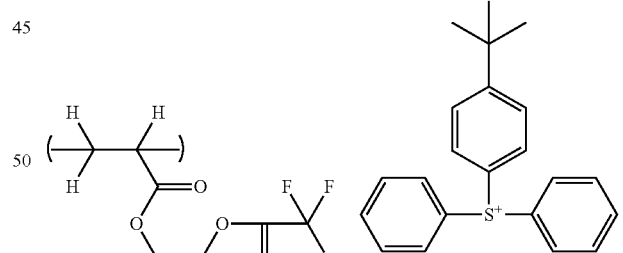
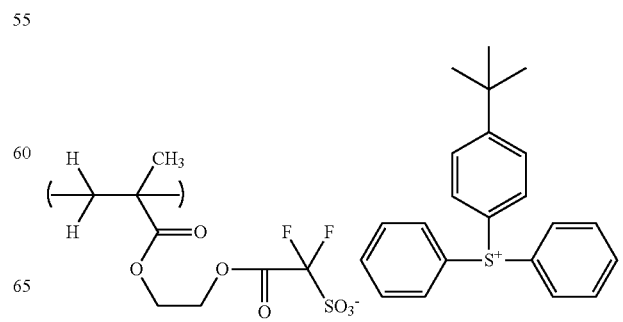

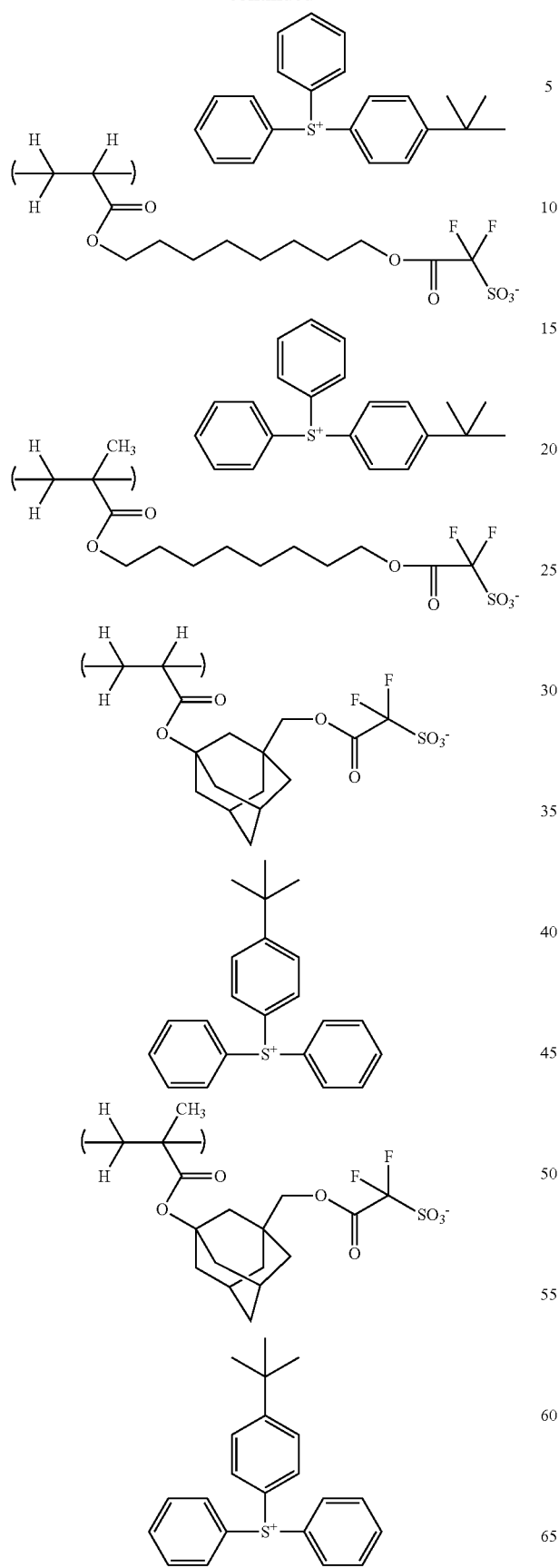
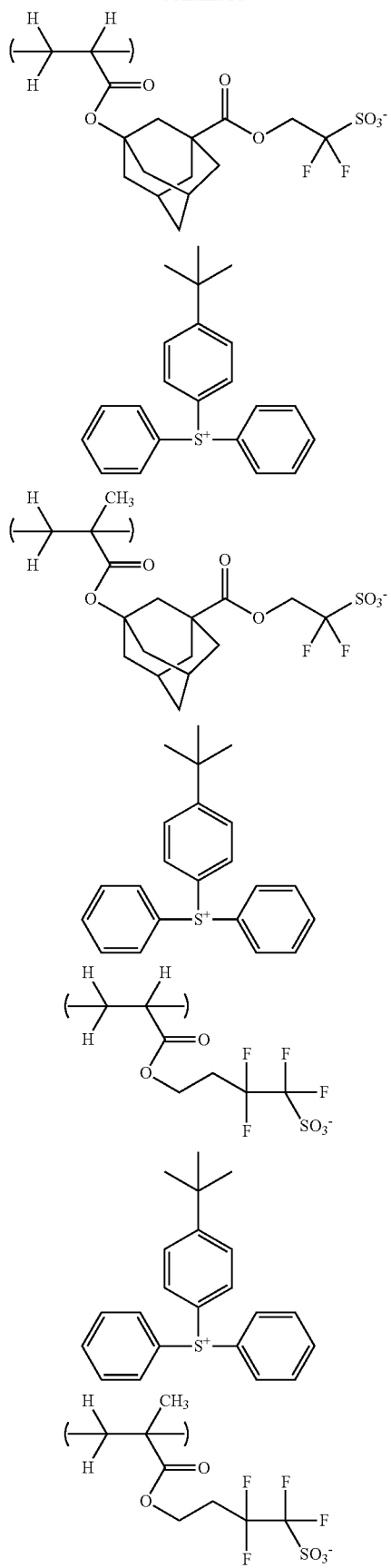

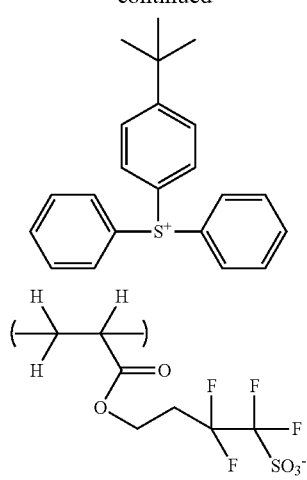
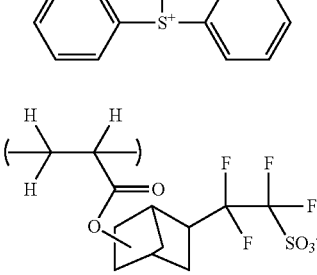
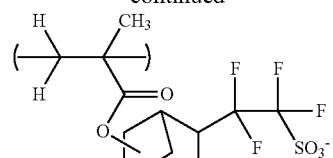
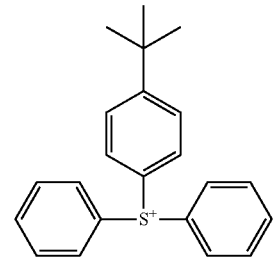
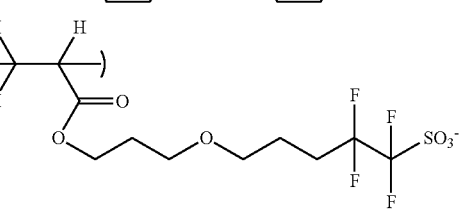
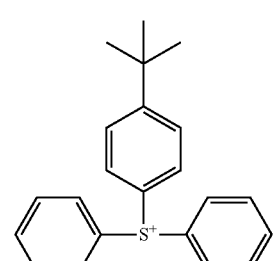
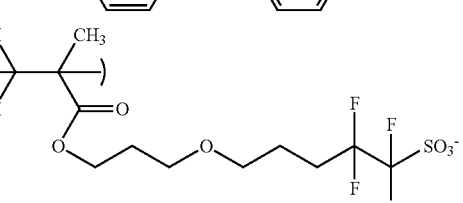
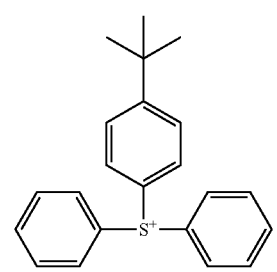
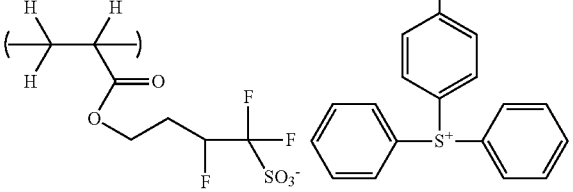

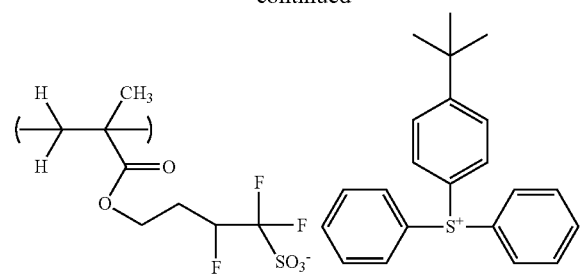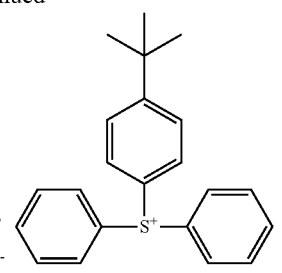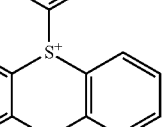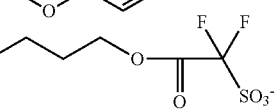
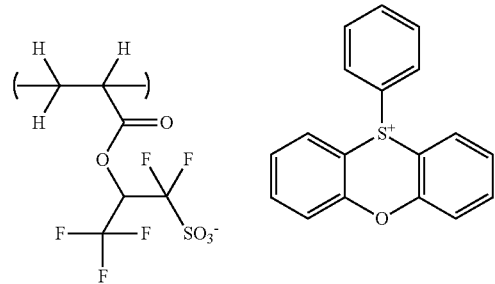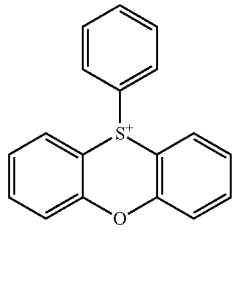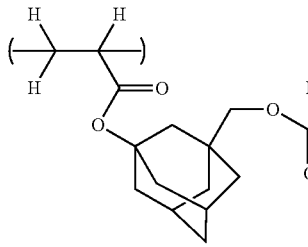
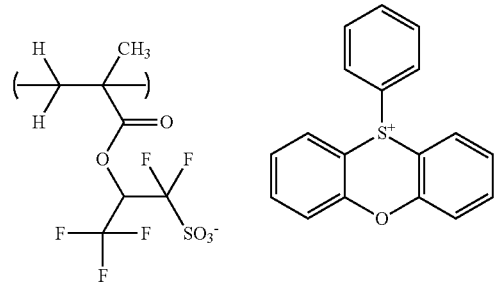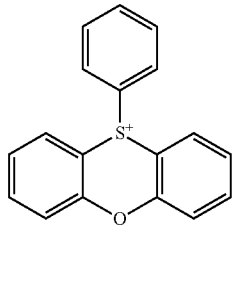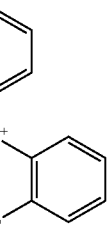
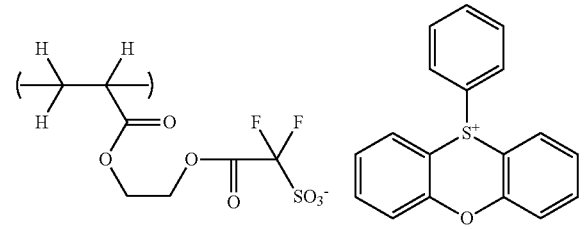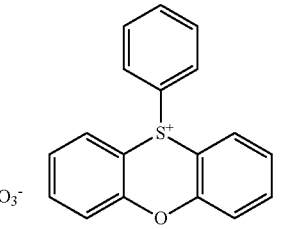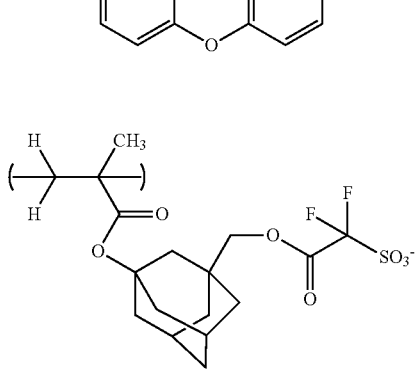
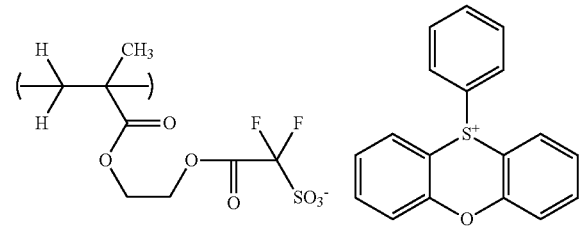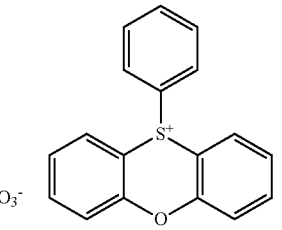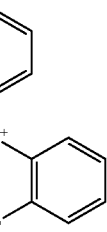
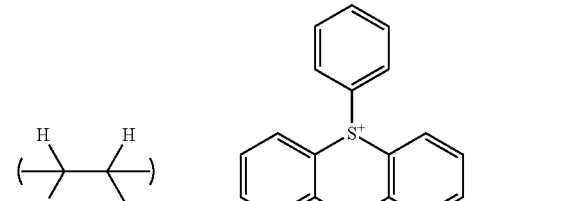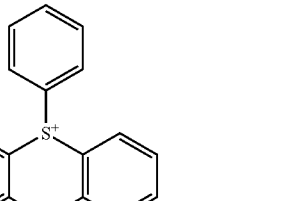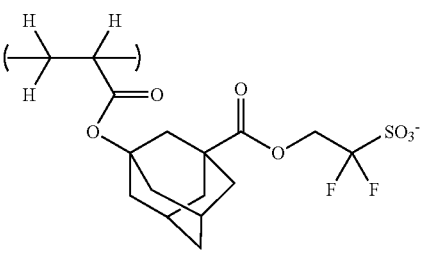
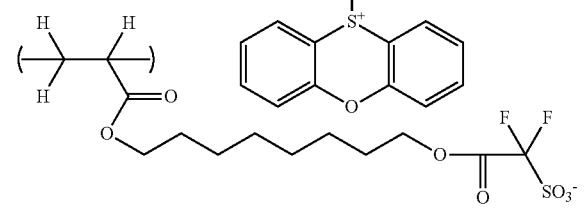

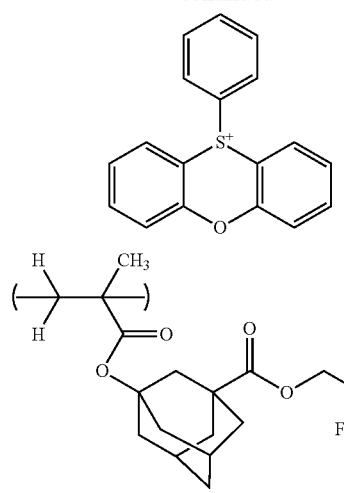
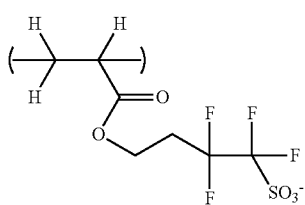
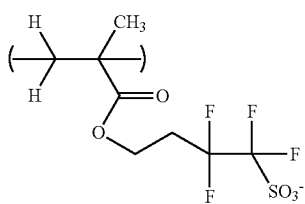
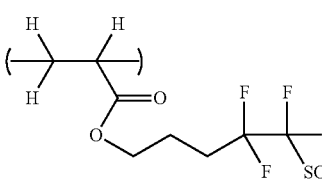
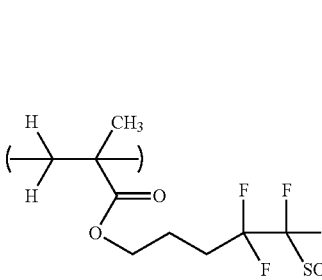
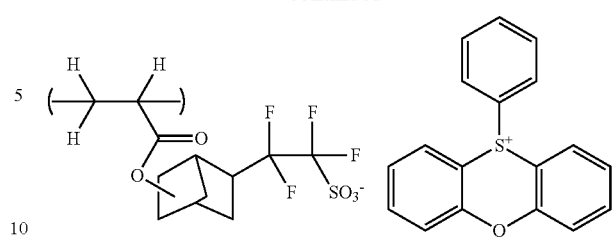
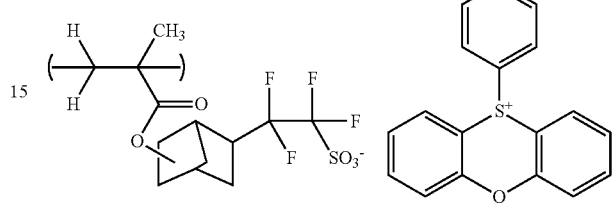
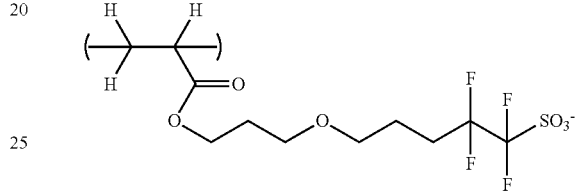
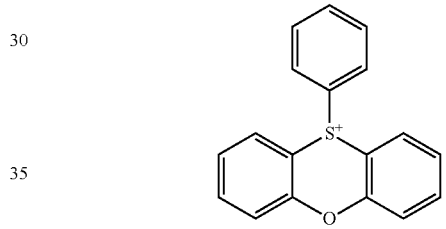
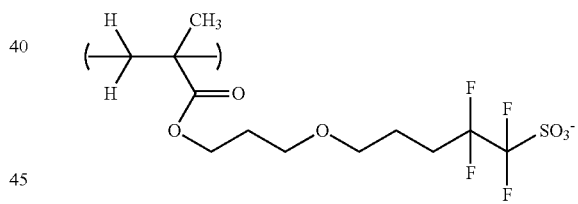
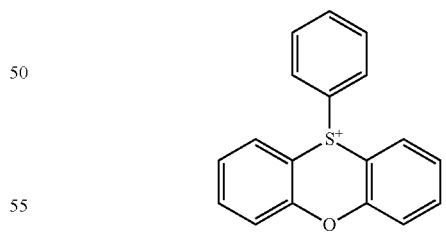
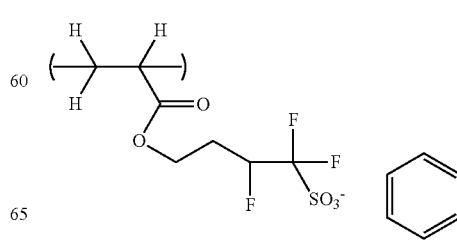

-continued

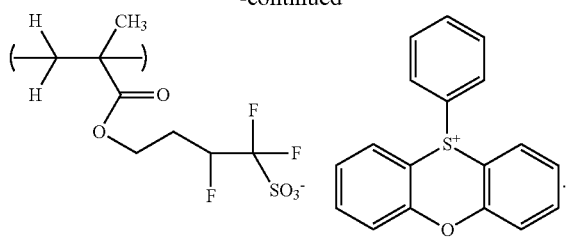

14. The resist composition of claim 1, wherein the recurring units containing an aromatic ring structure are present in an amount of at least 70 mol % and the recurring units having formula (1) are present in an amount of up to 4 mol %, based on the entire recurring units of the polymer.

15. The resist composition of claim 1, wherein the units protected with the acid labile group and adapted to turn alkali soluble under the action of acid are incorporated in a range of 5 to 45 mol % base on the entire recurring units of the polymer.

* * * * *